(12) United States Patent
Jeon et al.

(10) Patent No.: US 11,844,243 B2
(45) Date of Patent: Dec. 12, 2023

(54) DISPLAY DEVICE AND ELECTRONIC APPARATUS

(71) Applicant: Samsung Display Co., Ltd., Yongin-si (KR)

(72) Inventors: Yujin Jeon, Yongin-si (KR); Wonse Lee, Yongin-si (KR); Sukyoung Kim, Yongin-si (KR); Donghyeon Jang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 191 days.

(21) Appl. No.: 17/443,426

(22) Filed: Jul. 26, 2021

(65) Prior Publication Data
US 2022/0140023 A1 May 5, 2022

(30) Foreign Application Priority Data

Nov. 3, 2020 (KR) .................. 10-2020-0145528

(51) Int. Cl.
*H10K 59/122* (2023.01)
*H10K 50/844* (2023.01)

(52) U.S. Cl.
CPC ......... *H10K 59/122* (2023.02); *H10K 50/844* (2023.02)

(58) Field of Classification Search
CPC .... H10K 59/122; H10K 59/124; H10K 59/65; H10K 59/00; H10K 59/12; H10K 50/844; H10K 50/841; H10K 50/8426
See application file for complete search history.

(56) References Cited

U.S. PATENT DOCUMENTS

| 7,709,834 B2 | 5/2010 | Cho et al. | |
| 10,049,618 B2 | 8/2018 | Jeong | |
| 2019/0252475 A1* | 8/2019 | Sung | H10K 50/8428 |
| 2019/0355930 A1 | 11/2019 | Lee et al. | |
| 2020/0124910 A1 | 4/2020 | Hwang et al. | |
| 2020/0273927 A1* | 8/2020 | Oh | H10K 59/121 |
| 2021/0098556 A1* | 4/2021 | Jang | H10K 59/60 |

FOREIGN PATENT DOCUMENTS

| CN | 109856849 A | 6/2019 |
| KR | 10-1198907 B1 | 11/2012 |
| KR | 10-2016-0119909 A | 10/2016 |
| KR | 10-2019-0132602 A | 11/2019 |
| KR | 10-2020-0046222 A | 5/2020 |

* cited by examiner

*Primary Examiner* — Shaun M Campbell
(74) *Attorney, Agent, or Firm* — Lewis Roca Rothgerber Christie LLP

(57) ABSTRACT

A display device includes: a substrate having a transmission area, a display area surrounding the transmission area, and an intermediate area between the transmission area and the display area; and an organic insulating layer located on the substrate and including a first portion and a second portion. The first portion has a first hole corresponding to the transmission area. The second portion surrounds the first portion and has an upper surface forming a step with an upper surface of the first portion. The display device further includes: display elements located on the organic insulating layer in the display area; a partition wall located on the organic insulating layer in the intermediate area; and a filling material layer overlapping the transmission area.

20 Claims, 11 Drawing Sheets

DISPLAY DEVICE AND ELECTRONIC APPARATUS

CROSS-REFERENCE TO RELATED APPLICATION

This application claims priority to and the benefit of Korean Patent Application No. 10-2020-0145528, filed on Nov. 3, 2020, in the Korean Intellectual Property Office (KIPO), the entire disclosure of which is incorporated by reference herein.

BACKGROUND

1. Field

The present disclosure relates to a display device and an electronic apparatus, and more particularly, to a display device having a transmission area, and an electronic apparatus.

2. Description of Related Art

As display devices have become thinner and lighter, the usage of display devices has steadily diversified and expanded.

As the area occupied by a display area in display devices has been expanded, various functions combined with or linked to display devices have been added. As a way to add various functions to a display device while expanding a display area, there is ongoing research on display devices that have an area in which various functions other than displaying an image are added inside the display area.

SUMMARY

Aspects of one or more embodiments of the present disclosure are directed towards a high-display quality display device including a transmission area capable of transmitting light as an area for adding various suitable functions into a display area, and an electronic apparatus. However, the scope of the present disclosure is not limited thereto.

Additional aspects of the present disclosure will be set forth in part in the description that follows and, in part, will be apparent from the description, or may be learned by practice of the embodiments of the present disclosure described herein.

According to an embodiment, a display device includes a substrate having a transmission area, a display area surrounding the transmission area, and an intermediate area between the transmission area and the display area, an organic insulating layer located on the substrate and including a first portion and a second portion, wherein the first portion has a first hole corresponding to the transmission area, and wherein the second portion surrounds the first portion and has an upper surface forming a step with an upper surface of the first portion, display elements located on the organic insulating layer in the display area, a partition wall located on the organic insulating layer in the intermediate area, and a filling material layer overlapping the transmission area, wherein a distance from an upper surface of the substrate to the upper surface of the first portion is less than a distance from the upper surface of the substrate to the upper surface of the second portion.

The first portion and the second portion may be a single body.

The partition wall may overlap the second portion.

A first distance from a virtual center line perpendicular to the upper surface of the substrate and passing through a center of the transmission area to a stepped point of the first portion and the second portion may be less than or equal to a second distance from the virtual center line to the partition wall.

A stepped point of the first portion and the second portion may be located between the partition wall and a center of the transmission area.

The display device may further include a pixel-defining layer located between the organic insulating layer and the partition wall. The pixel-defining layer having a step difference and continuously covering the first portion and the second portion.

The second portion of the organic insulating layer may have a closed-loop shape surrounding the transmission area in a plan view.

The second portion of the organic insulating layer may include protrusions arranged along a periphery of the transmission area in a plan view.

The protrusions may be spaced from each other at regular intervals.

The partition wall may have a closed-loop shape surrounding the transmission area in a plan view.

The display device may further include an encapsulation substrate facing the substrate, and the filling material layer may be located between the substrate and the encapsulation substrate.

An edge of the filling material layer may be located near the partition wall.

According to another embodiment, an electronic apparatus includes a display device having a transmission area, a display area surrounding the transmission area, and an intermediate area between the transmission area and the display area, and a component overlapping the transmission area, wherein the display device includes a substrate, an organic insulating layer located on the substrate and including a first portion and a second portion, wherein the first portion has a first hole corresponding to the transmission area, and wherein the second portion surrounds the first portion and has an upper surface forming a step with an upper surface of the first portion, display elements located on the organic insulating layer in the display area, a partition wall located on the organic insulating layer in the intermediate area, an encapsulation substrate covering the display elements and the partition wall, and a filling material layer located between the substrate and the encapsulation substrate in the transmission area, and wherein a distance from an upper surface of the substrate to the upper surface of the first portion is less than a distance from the upper surface of the substrate to the upper surface of the second portion.

The first portion and the second portion may be a single body.

The partition wall may overlap the second portion.

A first distance from a virtual center line perpendicular to the upper surface of the substrate and passing through a center of the transmission area to a stepped point of the first portion and the second portion may be less than or equal to a second distance from the virtual center line to the partition wall.

A stepped point of the first portion and the second portion may be located between the partition wall and a center of the transmission area.

The display device may further include a pixel-defining layer located between the organic insulating layer and the partition wall. The pixel-defining layer continuously covering the first portion and the second portion and having a step difference.

The second portion of the organic insulating layer may have a closed-loop shape surrounding the transmission area in a plan view.

The second portion of the organic insulating layer may include protrusions arranged along a periphery of the transmission area in a plan view.

The protrusions may be spaced from each other at regular intervals.

An edge of the filling material layer may be located near the partition wall.

These and/or other aspects will become apparent and more readily appreciated from the following description of the embodiments, the accompanying drawings, and claims.

BRIEF DESCRIPTION OF THE DRAWINGS

The above and other aspects and features of embodiments of the present disclosure will be more apparent from the following description taken in conjunction with the accompanying drawings, in which.

DETAILED DESCRIPTION

Figure 1:
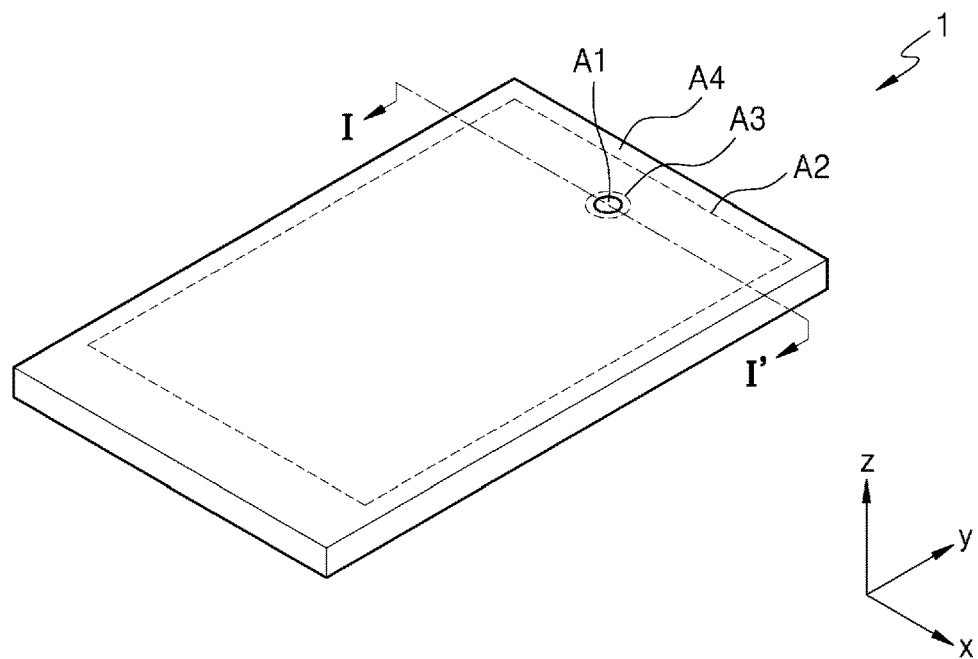
FIG. 1 is a perspective view schematically illustrating a portion of a display device according to an embodiment.

Reference will now be made in detail to embodiments, examples of which are illustrated in the accompanying drawings, wherein like reference numerals refer to like elements throughout the present disclosure. In this regard, the present embodiments may have different forms and should not be construed as being limited to the descriptions set forth herein. Accordingly, the embodiments are merely described below, by referring to the figures, to explain aspects of the present disclosure. As used herein, the term "and/or" includes any and all combinations of one or more of the associated listed items. Throughout the present disclosure, the expression "at least one of a, b, or c" indicates only a, only b, only c, both a and b, both a and c, both b and c, all of a, b, and c, or any variations thereof.

The present disclosure may include various embodiments and modifications, and embodiments thereof will be illustrated in the drawings and will be described herein in detail. The effects and features of the present disclosure and the accompanying methods thereof will become apparent from the following description of the embodiments, taken in conjunction with the accompanying drawings. However, the present disclosure is not limited to the embodiments described below, and may be embodied in various modes.

Reference will now be made in detail to embodiments, examples of which are illustrated in the accompanying drawings. In the drawings, the same or corresponding elements are denoted by the same reference numerals, and a repeated explanation thereof will not be given.

It will be understood that although the terms "first," "second," etc. may be used herein to describe various elements, those elements should not be limited by these terms. These elements are only used to distinguish one element from another element.

As used herein, the singular forms "a," "an," and "the" are intended to include the plural forms as well, unless the context clearly indicates otherwise.

It will be further understood that terms such as "comprise," "include," and "have" used herein specify the presence of stated features or elements, but do not preclude the presence or addition of one or more other features or elements.

It will be further understood that when a layer, region, or element is referred to as being "formed on" another layer, region, or element, it may be directly or indirectly formed on the other layer, region, or element. That is, for example, intervening layers, regions, or elements may be present therebetween.

Sizes of elements in the drawings may be exaggerated or contracted for convenience of explanation. In other words, because sizes and thicknesses of elements in the drawings are arbitrarily illustrated for convenience of explanation, the following embodiments are not limited thereto.

When an embodiment may be implemented differently, a specific process order may be performed differently from the described order. For example, two consecutively described processes may be performed substantially at the same time or performed in an order opposite to the described order.

In the present disclosure, the term "and/or" includes any and all combinations of one or more of the associated listed items. For example, "A and/or B" may include "A," "B," or "A and B." In addition, "at least one of A and B" is used herein in order to select only A, select only B, or select both A and B.

It will be understood that when a layer, region, or element is referred to as being "connected," the layer, the region, or the element may be directly connected or may be indirectly connected with intervening layers, regions, or elements therebetween. For example, when a layer, a region, or an element is electrically connected, the layer, the region, or the element may be directly electrically connected and/or may be indirectly electrically connected with intervening layers, regions, or elements therebetween.

Further, the use of "may" when describing embodiments of the present disclosure refers to "one or more embodiments of the present disclosure".

In the drawings, the relative sizes of elements, layers, and regions may be exaggerated and/or simplified for clarity. Spatially relative terms, such as "beneath," "below,"

"lower," "above," "upper," "bottom," "top," and the like, may be used herein for ease of description to describe one element or feature's relationship to another element(s) or feature(s) as illustrated in the drawings. It will be understood that the spatially relative terms are intended to encompass different orientations of the device in use or operation in addition to the orientation depicted in the drawings. For example, if the device in the drawings is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

As used herein, the terms "substantially," "about," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and refers to within an acceptable range of deviation for the particular value as determined by one of ordinary skill in the art, considering the measurement in question and the error associated with measurement of the particular quantity (i.e., the limitations of the measurement system). For example, "about" may refer to within one or more standard deviations, or within ±30%, 20%, 10%, 5% of the stated value.

In the following embodiments, the x-axis, the y-axis, and the z-axis are not limited to three axes of a rectangular coordinate system, and may be interpreted in a broader sense. For example, the x-axis, y-axis, and z-axis may be perpendicular to one another, or may represent different directions that are not perpendicular to one another.

Unless otherwise defined, all terms (including technical and scientific terms) used herein have the same meaning as commonly understood by one of ordinary skill in the art to which this disclosure pertains. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a perspective view schematically illustrating a display device 1 according to an embodiment.

Referring to FIG. 1, the display device 1 according to an embodiment may include a first area A1 and a second area A2 surrounding the first area A1. A plurality of pixels, for example, an array of pixels may be arranged in the second area A2, and the second area A2 may display an image through the array of pixels. The second area A2 may include an active area in which an image may be displayed. The first area A1 may be surrounded (e.g., entirely surrounded) by the second area A2. The first area A1 may be an area in which components capable of providing various suitable functions to the display device 1 are arranged. For example, when the component includes a sensor or a camera using light, the first area A1 corresponds to a transmission area through which light from the sensor or light traveling to the camera may pass.

A third area A3 may be provided between the first area A1 and the second area A2. The third area A3 may be a non-display area in which no pixels are arranged, and lines bypassing the first area A1 may be arranged in the third area A3. For example, lines extending towards the first area A1 may extend through or bend in the third area A3 around the first area A1 instead of extending into the first area A1. Similar to the third area A3, A fourth area A4 surrounding the second area A2 may be a non-display area in which no pixels are arranged, and various suitable types of lines, embedded circuits, and the like may be arranged in the fourth area A4.

Each of pixels provided in the display device 1 may include a light-emitting diode as a display element capable of emitting light of a color. The light-emitting diode may include an organic light-emitting diode including an organic material as an emission layer. In some embodiments, the light-emitting diode may include an inorganic light-emitting diode. In some embodiments, the light-emitting diode may include quantum dots as an emission layer. Hereinbelow, for convenience of description, a case where the light-emitting diode includes an organic light-emitting diode will be described. However, the present disclosure is not limited thereto.

FIG. 1 shows that the first area A1 is arranged in a center portion of the second area A2 in a width direction (e.g., a ±x direction) of the display device 1, but in another embodiment, the first area A1 may be arranged to be offset to a left or right side of the width direction of the display device 1. In addition, the first area A1 may be arranged at various suitable positions, such as on an upper side, a middle, or a lower side in a longitudinal direction (e.g., a ±y direction) of the display device 1.

In addition, although FIG. 1 shows a case where the display device 1 includes one first area A1, in another embodiment, the display device 1 may include a plurality of first areas A1.

Figure 2:
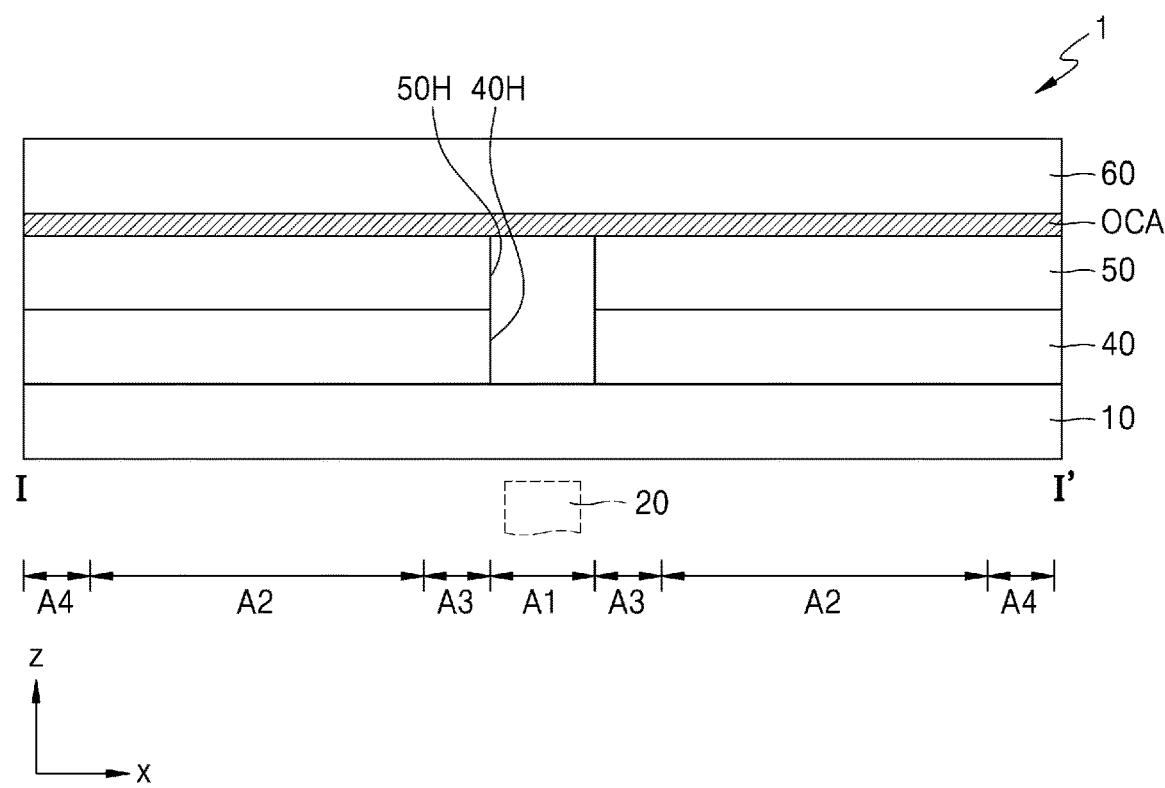
FIG. 2 is a cross-sectional view schematically illustrating a portion of a display device according to an embodiment.
Figure 3:
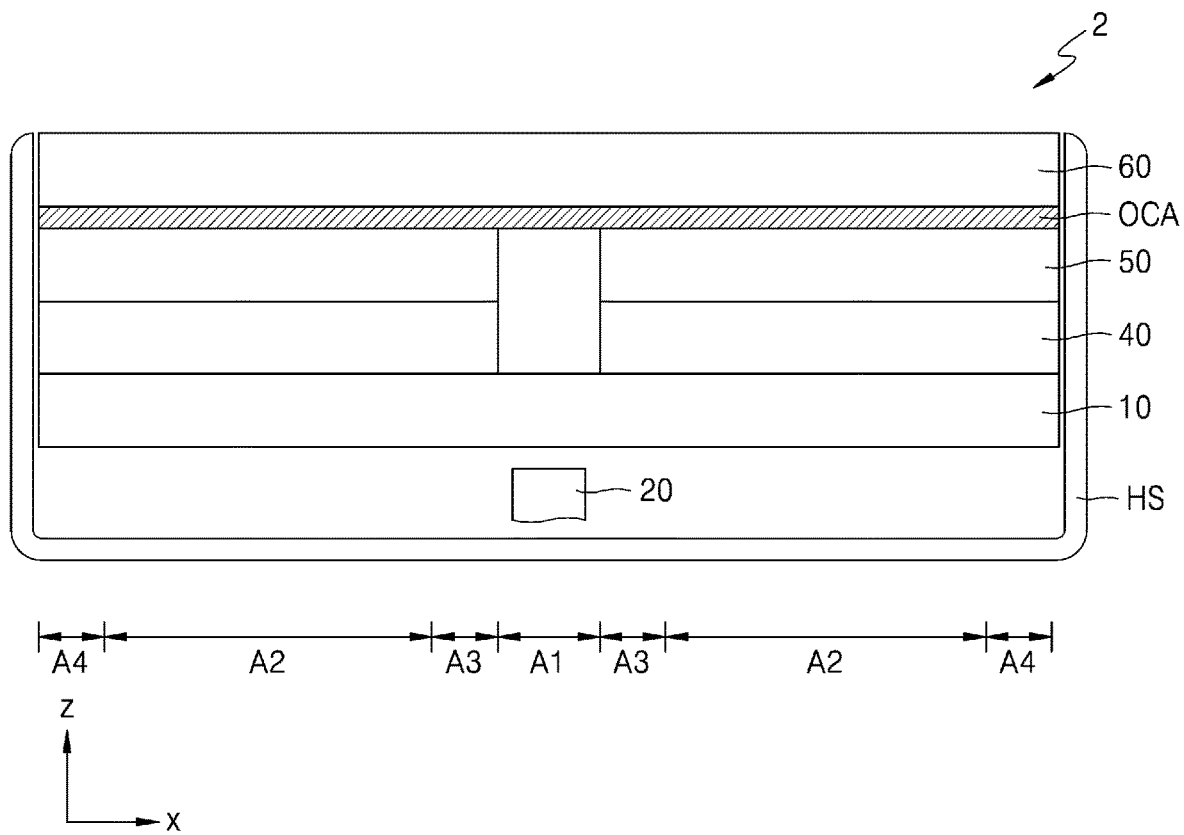
FIG. 3 is a cross-sectional view schematically illustrating a portion of an electronic apparatus according to an embodiment.

FIG. 2 is a cross-sectional view schematically illustrating a portion of a display device taken along the line I-I' in FIG. 1, according to an embodiment. FIG. 3 is a cross-sectional view schematically illustrating a portion of an electronic apparatus 2 according to an embodiment.

Referring to FIG. 2, the display device 1 according to an embodiment may include a display panel 10, an input sensing section 40 arranged on the display panel 10, and an optical functional section 50, which may be covered with a window 60. In an embodiment, the window 60 may be coupled to an element therebelow, for example, the optical functional section 50 through an adhesive layer such as an optical clear adhesive (OCA). The display device 1 may be provided in various suitable electronic apparatuses 2 (e.g., see FIG. 3), such as mobile phones, tablet PCs, notebook computers, and smart watches.

The display panel 10 may include a plurality of light-emitting diodes in the second area A2. The display panel 10 may include lines (e.g., data lines, scan lines, driving voltage lines, common voltage lines, or the like) for respectively providing signals or voltages to the plurality of light-emitting diodes, and transistors respectively connected (e.g., electrically connected) to the plurality of light-emitting diodes.

The input sensing section 40 may obtain coordinate information according to an external input, for example, a touch event. The input sensing section 40 may include a sensing electrode or a touch electrode and trace lines connected to the sensing electrode. The input sensing section 40 may be arranged on the display panel 10. The input sensing section 40 may detect an external input using a mutual cap method (e.g., a mutual capacitance method) or a self cap method (e.g., self-capacitance method).

The input sensing section 40 may be directly on the display panel 10. In some embodiments, the input sensing section 40 may be separately formed and then coupled to the display panel 10 through an adhesive layer such as an OCA. In an embodiment, as shown in FIG. 2, the input sensing section 40 may be directly on the display panel 10, and in this case, the adhesive layer may not be present between the input sensing section 40 and the display panel 10.

The optical functional section 50 may include an anti-reflection layer. The anti-reflection layer may reduce the reflectance of (external) light incident on the anti-reflection layer through the window 60 from outside the display panel 10. The anti-reflection layer may include a retarder and a polarizer. The retarder may be of a film type or a liquid crystal coating type, and may include a $\lambda/2$ retarder and/or a $\lambda/4$ retarder. The polarizer may also be of a film type or a liquid crystal coating type. The film type may include a stretchable synthetic resin film, and the liquid crystal coating type may include liquid crystals arranged in a certain or suitable way. Each of the retarder and the polarizer may further include a protective film.

In another embodiment, the anti-reflection layer may include a structure of a black matrix and color filters. The color filters may be arranged by considering a color of light emitted from each of pixels of the display panel 10. For example, the position of each of the color filters may be based on the color of light emitted from a corresponding pixel of the display panel 10. In another embodiment, the anti-reflection layer may include a destructive interference structure. The destructive interference structure may include a first reflective layer and a second reflective layer arranged on different layers. First reflective light and second reflective light respectively reflected from the first reflective layer and the second reflective layer may destructively interfere with each other, and thus, the reflectance of external light may decrease.

The optical functional section 50 may include a lens layer. The lens layer may improve the emission efficiency of light emitted from the display panel 10 or reduce color deviation. The lens layer may include a layer having a concave or convex lens shape, and/or a plurality of layers having different refractive indices from each other. The optical functional section 50 may include all of the anti-reflection layer and the lens layer described above, or may include any one of them.

Each of the input sensing section 40 and the optical functional section 50 may include a hole. For example, the input sensing section 40 may include a hole 40H penetrating through upper and lower surfaces of the input sensing section 40, and the optical functional section 50 may include a hole 50H penetrating through upper and lower surfaces of the optical functional section 50. The hole 40H of the input sensing section 40 and the hole 50H of the optical functional section 50 may be arranged in the first area A1 to correspond to each other. For example, the hole 40H and the hole 50H may overlap in the thickness direction of the substrate 100 to form a single hole extending through the input sensing section 40 and the optical functional section 50 in the first area A1.

When an adhesive layer between the window 60 and the optical functional section 50 includes an OCA, the adhesive layer may not have a hole corresponding to the first area A1.

A component 20 may be arranged in the first area A1. The component 20 may include an electronic element. For example, the component 20 may be an electronic element using light or sound. For example, the electronic element may include a sensor that emits and/or receives light, such as an infrared sensor, a camera that receives light to capture an image, a sensor that outputs and senses light or sound to measure a distance or recognize a fingerprint, a small lamp that outputs light, and a speaker that outputs sound. In a case of an electronic element using light, light of various suitable wavelength bands, such as visible light, infrared light, ultraviolet light, and the like, may be used. In some embodiments, the first area A1 may be a transmission area through which light output from the component 20 to the outside or traveling from the outside toward the electronic element may be transmitted.

In another embodiment, when the display device 1 is used as a smart watch or an instrument panel for a vehicle, the component 20 may be an element such as a clock hand or a needle indicating information (e.g., a vehicle speed, etc.). When the display device 1 includes the clock hand or the instrument panel for the vehicle, the component 20 may be exposed to the outside through the window 60, and the window 60 may include an opening corresponding to the first area A1.

As described above, the component 20 may include element(s) capable of adding a function to the display device 1, or may include an element such as an accessory that increases the aesthetics of the display panel 10.

Referring to FIG. 3, the display device 1 may be provided in various suitable electronic apparatuses 2 such as mobile phones, tablet PCs, notebook computers, and smart watches. The electronic apparatus 2 may include a housing HS having an inner space, and the display panel 10 may be arranged in the housing HS. The window 60 may be coupled to the housing HS, and as described above, the input sensing section 40 and the optical functional section 50 may be arranged on the upper surface of display panel 10.

In this case, the component 20 may be arranged within the housing HS between the display panel 10 and an inner bottom surface of the housing HS. The component 20 may be located in the first area A1. In other words, the first area A1 may be a kind of component area in which the component 20 is arranged.

Figure 4:
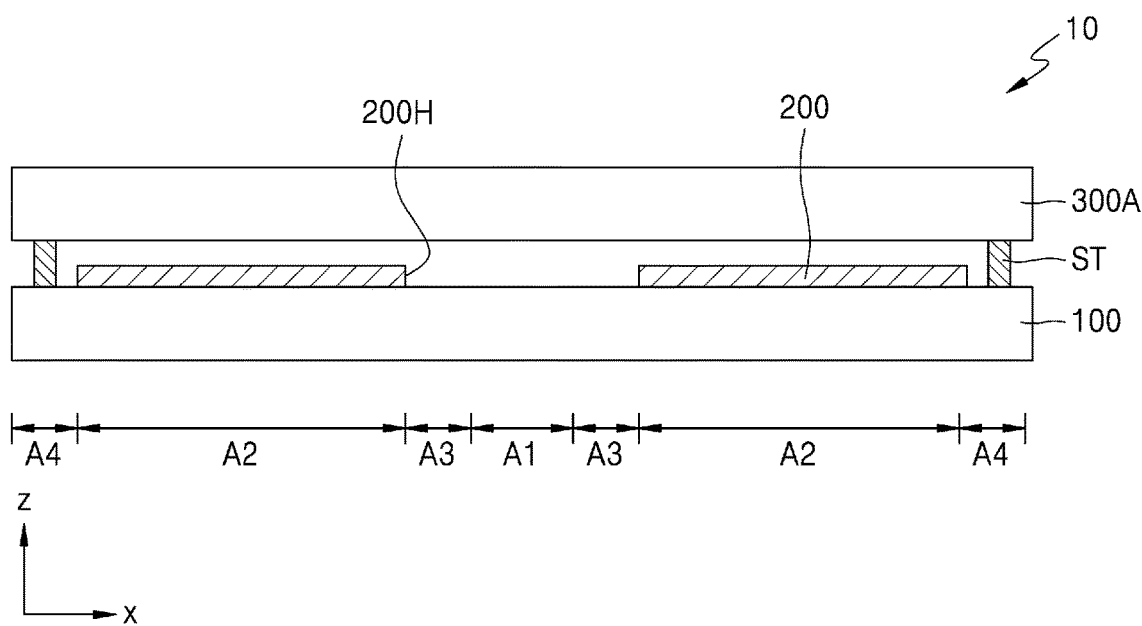
FIG. 4 is a cross-sectional view schematically illustrating a portion of a display panel according to an embodiment.

FIG. 4 is a cross-sectional view schematically illustrating a portion of a display panel 10 according to an embodiment.

Referring to FIG. 4, the display panel 10 according to an embodiment may include a substrate 100, a display layer 200, and an encapsulation substrate 300A.

The substrate 100 may include glass, metal, or a polymer resin. In a case where the substrate 100 is flexible or bendable, the substrate 100 may include a polymer resin such as polyethersulfone, polyacrylate, polyetherimide, polyethylene naphthalate, polyethylene terephthalate, polyphenylene sulfide, polyarylate, polyimide, polycarbonate, or cellulose acetate propionate. The substrate 100 may have a multi-layer structure including two layers each including such a polymer resin and a barrier layer arranged therebetween including an inorganic material such as silicon oxide, silicon nitride, and silicon oxynitride, and various suitable modifications are possible.

The display layer 200 may be arranged on the substrate 100. The display layer 200 may be arranged to correspond to the second area A2. That is, when viewed from a direction perpendicular to an upper surface of the substrate 100 (or in a plan view), the display layer 200 may overlap the second area A2. The display layer 200 may include a plurality of pixels. Each of the pixels included in the display layer 200 may include a pixel circuit and a display element connected (e.g., electrically connected) to the pixel circuit. The pixel circuit may include a transistor and a storage capacitor, and the display element may include a light-emitting diode, for example, an organic light-emitting diode (OLED).

The display layer 200 may be covered with the encapsulation substrate 300A. The encapsulation substrate 300A may include a glass material or a polymer resin. For example, the encapsulation substrate 300A may include a glass material including silicon oxide as a main component, or may include a resin such as reinforced plastic. The encapsulation substrate 300A may be arranged to face the substrate 100, and a sealant ST may be arranged between the substrate 100 and the encapsulation substrate 300A. The sealant ST may be arranged in the fourth area A4 and may surround (e.g., entirely surround) the display layer 200 between the substrate 100 and the encapsulation substrate 300A. When viewed from a direction perpendicular to the upper surface of the substrate 100 (or in a plan view), the second area A2 may be surrounded (e.g., entirely surrounded) by the sealant ST.

The sealant ST may be an inorganic material, for example, a frit. The sealant ST may be formed by using a dispenser or by applying it by a screen printing method. The frit generally refers to a glass raw material in the form of a powder, but the frit described herein also includes a paste state in which a laser or infrared absorber, an organic binder, a filler for reducing a thermal expansion coefficient, and the like are included in a main component such as silicon oxide or the like. The frit in the paste state may be cured by removing the organic binder and moisture through a drying or sintering process. The laser or infrared absorber may include a transition metal compound. Laser beam may be used as a heat source for bonding the substrate 100 to the encapsulation substrate 300A by curing the sealant ST.

A portion of the display layer 200, for example, a portion thereof corresponding to the first area A1 may be removed. In other words, the display layer 200 may not be present in the first area A1. In this regard, FIG. 4 shows that the display layer 200 includes a hole 200H corresponding to the first area A1 that is a transmission area. In addition to the above-described pixel circuits and display elements, the display layer 200 may further include insulating layers between lines respectively connected to the pixel circuits, between electrodes, and/or between electrodes of the display element. For example, the hole 200H of the display layer 200 may be formed by overlapping holes of the aforementioned insulating layers provided in the display layer 200.

FIG. 4 shows that the display layer 200 is sealed with the encapsulation substrate 300A and the sealant ST, but in another embodiment, the display layer 200 may be covered with a thin-film encapsulation layer in which at least one inorganic encapsulation layer and at least one organic encapsulation layer are stacked.

Figure 5:
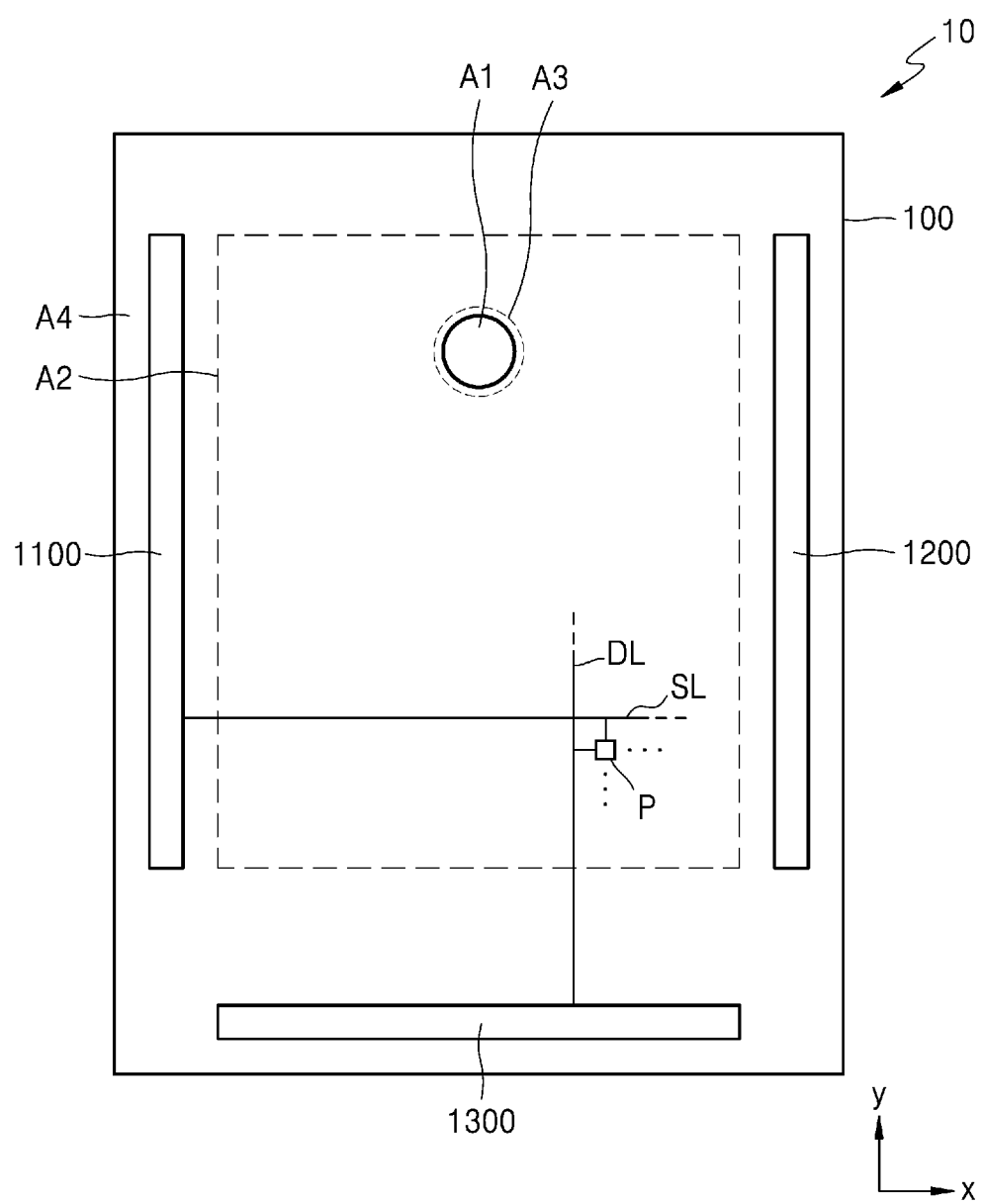
FIG. 5 is a plan view schematically illustrating a portion of a display panel according to an embodiment.
Figure 6:
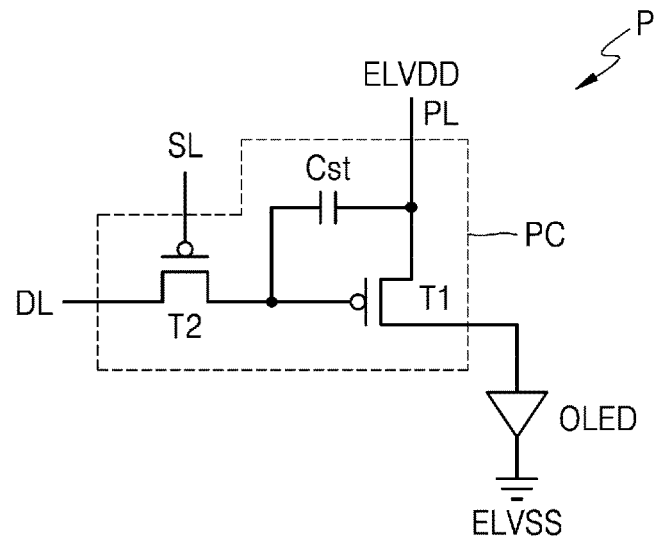
FIG. 6 is an equivalent circuit diagram of a pixel provided in a display panel according to an embodiment.

FIG. 5 is a plan view schematically illustrating a portion of a display panel 10 according to an embodiment, and FIG. 6 is an equivalent circuit diagram schematically illustrating a pixel P of the display panel 10 according to an embodiment.

The display panel 10 may include a first area A1, a second area A2 surrounding the first area A1, a third area A3 between the first area A1 and the second area A2, and a fourth area A4 surrounding the second area A2.

The display panel 10 may include a plurality of pixels P in the second area A2. As illustrated in FIG. 6, each of the pixels P may include a pixel circuit PC and a display element connected to the pixel circuit PC, for example, an organic light-emitting diode OLED. The pixel circuit PC may include a first transistor T1, a second transistor T2, and a storage capacitor Cst. Each of the pixels P may emit one of red light, green light, and blue light, or may emit one of red light, green light, blue light, and white light through the organic light-emitting diode OLED. Each of the first transistor T1 and the second transistor T2 may be implemented as a thin-film transistor.

The second thin-film transistor T2 herein also referred to as a switching transistor may be connected to a scan line SL and a data line DL and may transfer a data voltage received via the data line DL to the first transistor T1 according to a switching voltage received via the scan line SL. The storage capacitor Cst is connected to the second transistor T2 and a driving voltage line PL and may store a voltage corresponding to a voltage difference between a voltage received via the second transistor T2 and a first power voltage ELVDD applied to the driving voltage line PL.

The first transistor T1 herein also referred to as a driving transistor is connected to the driving voltage line PL and the storage capacitor Cst and may control a driving current flowing from the driving voltage line PL to the organic light-emitting diode OLED corresponding to a voltage stored in the storage capacitor Cst. The organic light-emitting diode OLED may emit light having a luminance according to the driving current. An opposite electrode (e.g., a cathode) of the organic light-emitting diode OLED may receive a second power voltage ELVSS.

FIG. 6 shows that the pixel circuit PC includes two transistors and one storage capacitor, but the present disclosure is not limited thereto. In other words, the number of thin-film transistors and/or the number of storage capacitors may vary according to the design of the pixel circuit PC without deviating from the scope of the present disclosure. For example, the pixel circuit PC may further include four, five, or more thin-film transistors in addition to the above-described two thin-film transistors. In addition, the pixel circuit PC may further include one or more capacitors in addition to the above-described storage capacitor Cst.

Referring to FIG. 5 again, the third area A3 may surround the first area A1. The third area A3 is an area in which a display element such as an organic light-emitting diode emitting light is not arranged, and signal lines providing signals to the pixels P around the first area A1 may pass through the third area A3. A first scan driver 1100 for providing a scan signal to each of the pixels P, a second scan driver 1200, a data driver 1300 for providing a data signal to each of the pixels P, and a main power line for providing the first and second power voltages may be arranged in the fourth area A4. The first scan driver 1100 and the second scan driver 1200 may be arranged in the fourth area and respectively arranged at opposite sides of the second area A2 with the second area A2 therebetween.

FIG. 5 shows that the data driver 1300 is arranged adjacent to one side of the substrate 100, but in another embodiment, the data driver 1300 may be arranged on a flexible printed circuit board (FPCB) connected (e.g., electrically connected) to a pad arranged at one side of the display panel 10.

Figure 7:
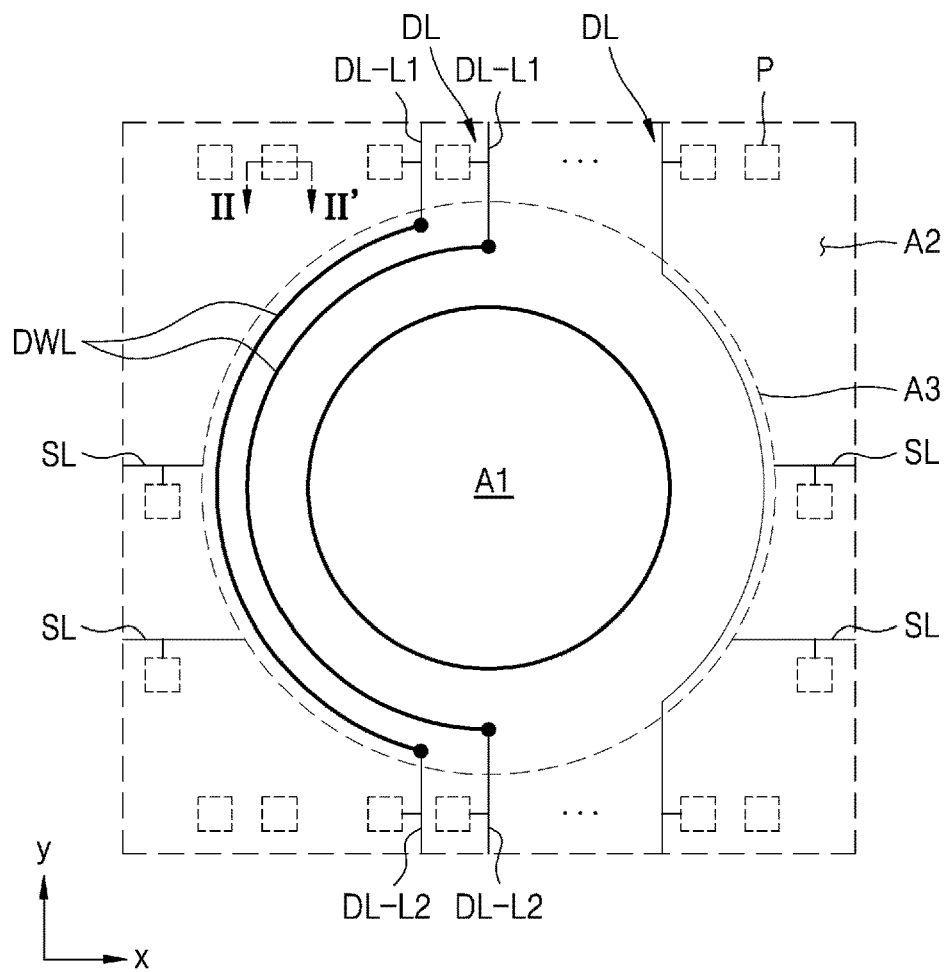
FIG. 7 is a plan view schematically illustrating a portion of a display panel according to an embodiment.

FIG. 7 is a plan view schematically illustrating a portion of a display panel according to an embodiment.

Referring to FIG. 7, some of pixels P in the second area A2 may be spaced from each other with respect to the first area A1. For example, the first area A1 may be located between two pixels P arranged in a ±x direction of FIG. 7. Similarly, the first area A1 may be located between two pixels P arranged in a ±y direction of FIG. 7.

The two pixels P arranged in the ±y direction with the first area A1 therebetween may be connected (e.g., electrically connected) to a same data line DL, which may be bent in the third area A3. In other words, the data line DL may be arranged to bypass along the first area A1. For example, a portion of the data line DL may be bent to extend along an edge (e.g., adjacent to an outer edge) of the first area A1 in the third area A3, for example, in an arc direction of the first area A1 (e.g., an arc direction corresponding to the outer edge of the first area A1).

In another embodiment, the data line DL may be disconnected with the first area A1 therebetween. In other words, the data line DL may include a first data line DL-L1 and a second data line DL-L2 that are spaced from each other with the first area A1 therebetween. The first data line DL-L1 and the second data line DL-L2 may be connected to each other by a bypass line DWL. The bypass line DWL may be arranged on a different layer from a layer on which the data line DL is arranged, and connected to the data line DL through a contact hole. For example, the bypass line DWL may be arranged at a different layer from the data line DL. The bypass line DWL may be arranged in the third area A3 so as to bypass along the edge of the first area A1.

The bypass line DWL described herein may refer to not only a connection line connecting lines that are disconnected with the first area A1 therebetween, but also all lines each extending from the second area A2 and passing through the third area A3.

In an embodiment, the two pixels P arranged in the ±x direction with the first area A1 therebetween may be connected (e.g., electrically connected) to different scan lines SL, respectively. Scan lines SL arranged on a left side of the first area A1 may be connected (e.g., electrically connected) to the first scan driver 1100 (e.g., see FIG. 5) described with reference to FIG. 5, and scan lines SL arranged on a right side of the first area A1 may be connected (e.g., electrically connected) to the second scan driver 1200 (e.g., see FIG. 5) described with reference to FIG. 5. As illustrated in FIG. 5, when the display panel 10 includes two scan driving circuits, the pixels P arranged at opposite sides of the first area A1 may be respectively connected (e.g., electrically connected) to the scan lines SL spaced from each other. In other words, some of the scan lines SL may be spaced from each other with the first area A1 therebetween.

In another embodiment, in a case where the second scan driver 1200 (e.g., see FIG. 5) is omitted, the two pixels P arranged in the ±x direction with the first area A1 therebetween may be connected to a same scan line, and, similar to the data line DL, the scan line may include a bypassing portion extending in the arc direction of the first area A1 in the third area A3.

Figure 8:
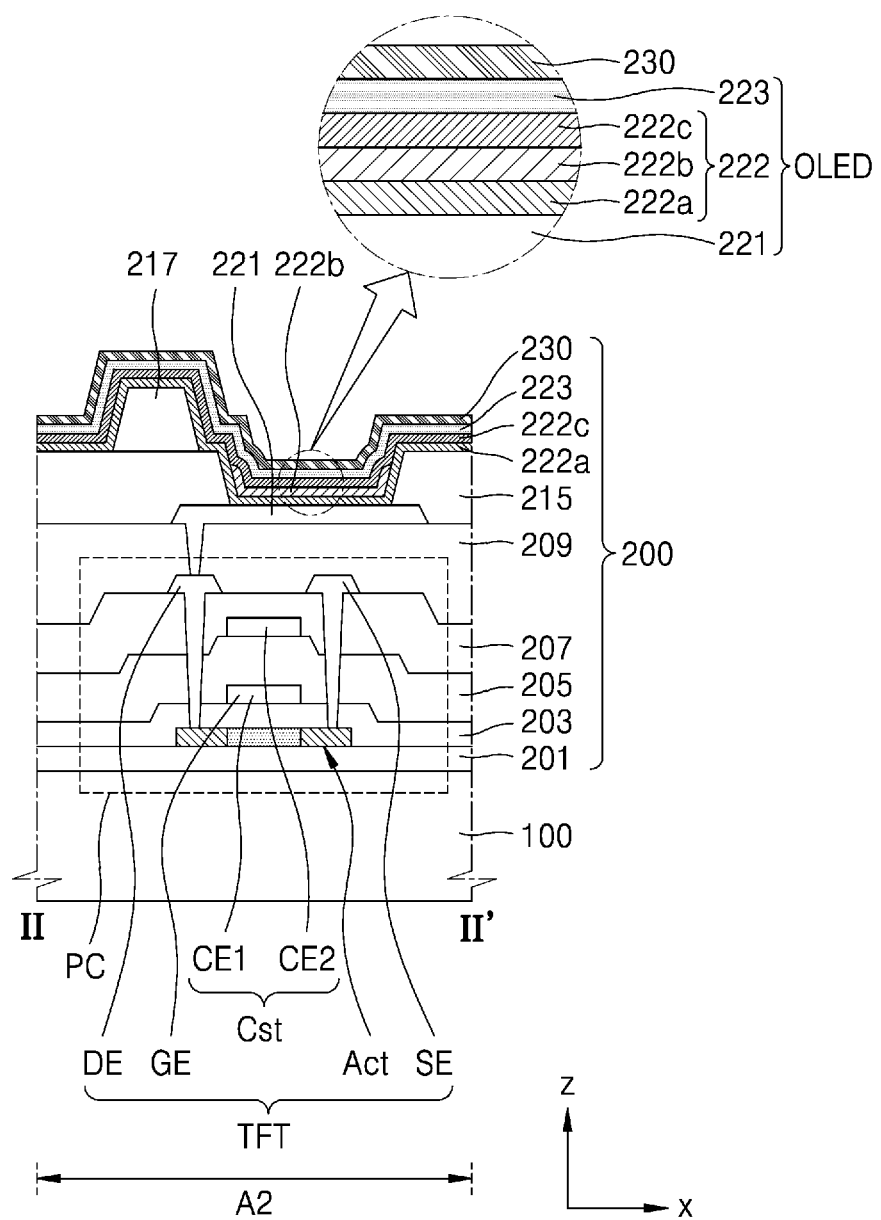
FIG. 8 is a cross-sectional view schematically illustrating a pixel provided in a display panel according to an embodiment.

FIG. 8 is a cross-sectional view schematically illustrating a pixel provided in a display panel according to an embodiment. FIG. 8 may correspond to a cross-sectional view of a pixel according to an embodiment, taken along the line II-II' in FIG. 7.

Referring to FIG. 8, the pixel circuit PC may be arranged on the substrate 100, and the organic light-emitting diode OLED connected (e.g., electrically connected) to the pixel circuit PC may be arranged on the pixel circuit PC. The substrate 100 may include glass or a polymer resin. The substrate 100 may be a single layer or multiple layers.

A buffer layer 201 may be located on the substrate 100. The buffer layer 201 may reduce or block the penetration of foreign matter, moisture, or ambient air into a lower portion of the substrate 100 and increase the smoothness of the upper surface of the substrate 100. The buffer layer 201 may include an inorganic material such as an oxide or a nitride, an organic material, or an organic-inorganic composite, and may include a single-layer or multi-layer structure of an inorganic material and an organic material. A barrier layer may be further included between the substrate 100 and the buffer layer 201 to block the penetration of ambient air.

The pixel circuit PC may be arranged on the buffer layer 201. The pixel circuit PC may include a thin-film transistor TFT and the storage capacitor Cst. The thin-film transistor TFT may include a semiconductor layer Act, a gate electrode GE, a source electrode SE, and a drain electrode DE. In the embodiment, the thin-film transistor TFT is a top-gate-type transistor in which the gate electrode GE is arranged on the semiconductor layer Act with a gate insulating layer 203 therebetween, but, in another embodiment, the thin-film transistor TFT may be of a bottom gate type.

The semiconductor layer Act may be arranged on the buffer layer 201. The semiconductor layer Act may include a channel area, a source area, and a drain area, and the source area and the drain area are doped with impurities and arranged at opposite sides of the channel area, respectively. In this case, the impurities may include N-type impurities or P-type impurities. The semiconductor layer Act may include amorphous silicon or polysilicon. For example, the semiconductor layer Act may include an oxide of at least one material selected from the group consisting of indium (In), gallium (Ga), tin (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn). The semiconductor layer Act may include a Zn oxide-based material such as Zn oxide, In—Zn oxide, Ga—In—Zn oxide, or the like. The semiconductor layer Act may include an In—Ga—Zn—O (IGZO), In—Sn—Zn—O (ITZO), or In—Ga—Sn—Zn—O (IGTZO) semiconductor, in which metal such as In, Ga, and Sn is included in Zn oxide.

The gate electrode GE may be above the semiconductor layer Act so as to at least partially overlap the semiconductor layer Act. For example, the gate electrode GE may overlap the channel area of the semiconductor layer Act. The gate electrode GE may include various suitable conductive materials including Mo, Al, Cu, Ti, or the like, and may have various suitable layered structures. For example, the gate electrode GE may include a Mo layer and an Al layer, or may have a multi-layer structure of a Mo layer, an Al layer, and another Mo layer. Also, in another embodiment, the gate electrode GE may have a multi-layer structure including an ITO layer that covers a metal material.

The gate insulating layer 203 between the semiconductor layer Act and the gate electrode GE may include an inorganic insulating material such as silicon oxide, silicon nitride, silicon oxynitride, aluminum oxide, titanium oxide, tantalum oxide, and hafnium oxide. The gate insulating layer 203 may be a single layer or multiple layers including the above-described material.

The source electrode SE and the drain electrode DE may include various suitable conductive materials including Mo, Al, Cu, Ti, or the like, and may have various suitable layered structures. For example, each of the source electrode SE and the drain electrode DE may include a Ti layer and an Al layer, or may include a multi-layer structure of a Ti layer, an Al layer, and another Ti layer. The source electrode SE and the drain electrode DE may be respectively connected to a source area and a drain area of the semiconductor layer Act through respective contact holes. In addition, in another embodiment, each of the source electrode SE and the drain electrode DE may have a multi-layer structure including an indium tin oxide (ITO) layer covering a metal material.

The storage capacitor Cst may include a lower electrode CE1 and an upper electrode CE2 overlapping each other with a first interlayer insulating layer 205 therebetween. The storage capacitor Cst may overlap the thin-film transistor TFT. The lower electrode CE1 and the upper electrode CE2 overlap each other with the first interlayer insulating layer 205 therebetween to form a capacitor. In other words, capacitance is formed between the lower electrode CE1 and the upper electrode CE2. In this case, the first interlayer insulating layer 205 serves as a dielectric layer of the storage capacitor Cst. In this regard, FIG. 8 shows the gate electrode GE of the thin-film transistor TFT as the lower electrode CE1 of the storage capacitor Cst. In another embodiment, the storage capacitor Cst may not overlap the thin-film transistor TFT. The storage capacitor Cst may be covered with a second interlayer insulating layer 207.

Each of the first interlayer insulating layer 205 and the second interlayer insulating layer 207 may include an inorganic insulating material such as silicon oxide, silicon nitride, silicon oxynitride, aluminum oxide, titanium oxide, tantalum oxide, hafnium oxide, and the like. Each of the first interlayer insulating layer 205 and the second interlayer insulating layer 207 may be a single layer or multiple layers including the above-described material.

In an embodiment, the gate insulating layer 203, the first interlayer insulating layer 205, the second interlayer insulating layer 207, etc. each including the above-described inorganic material may be formed through chemical vapor deposition (CVD) or atomic layer deposition (ALD), but are not limited thereto.

The pixel circuit PC including the thin-film transistor TFT and the storage capacitor Cst may be covered with an organic insulating layer 209. For example, the organic insulating layer 209 may cover the source electrode SE and the drain electrode DE. The organic insulating layer 209 may be arranged on the substrate 100 over the display area and a peripheral area outside the display area. The organic insulating layer 209 is a planarization insulating layer, and may include a surface having a substantially flat top surface. The organic insulating layer 209 may include an organic insulating material, such as a general purpose polymer such as poly(methyl methacrylate) (PMMA) or polystyrene (PS), a polymer derivative having a phenol-based group, an acryl-based polymer, an imide-based polymer, aryl-ether-based polymer, amide-based polymer, fluorine-based polymer, p-xylene-based polymer, vinyl alcohol-based polymer, and any suitable blends thereof. In an embodiment, the organic insulating layer 209 may include polyimide.

A pixel electrode 221 may be formed on the organic insulating layer 209. The pixel electrode 221 may include a conductive oxide such as indium tin oxide (ITO), indium zinc oxide (IZO), zinc oxide (ZnO), indium oxide ($In_2O_3$), indium gallium oxide (IGO), aluminum zinc oxide (AZO), or the like. In another embodiment, the pixel electrode 221 may include a reflective film including silver (Ag), magnesium (Mg), aluminum (Al), platinum (Pt), palladium (Pd), gold (Au), nickel (Ni), neodymium (Nd), iridium (Ir), chromium (Cr), or any compounds thereof. In another embodiment, the pixel electrode 221 may further include a layer including ITO, IZO, ZnO, or $In_2O_3$ above/below the above-described reflective layer.

A pixel-defining layer 215 may be formed on the pixel electrode 221. The pixel-defining layer 215 may include an opening through which an upper surface of the pixel electrode 221 is exposed, and may cover an edge of the pixel electrode 221. The pixel-defining layer 215 may include an organic insulating material. In some embodiments, the pixel-defining layer 215 may include an inorganic insulating material such as silicon nitride, silicon oxynitride, or silicon oxide. In some embodiments, the pixel-defining layer 215 may include an organic insulating material and an inorganic insulating material.

An intermediate layer 222 may include an emission layer 222b. For example, the emission layer 222b may include an organic material. The emission layer 222b may include a polymer or low-molecular-weight organic material that emits light of a color. The intermediate layer 222 may include a first functional layer 222a below the emission layer 222b and/or a second functional layer 222c above the emission layer 222b.

The first functional layer 222a may be a single layer or multiple layers. For example, when the first functional layer 222a includes a polymer material, the first functional layer 222a is a hole transport layer (HTL) having a single-layer structure and may include poly(3,4-ethylenedioxythiophene) (PEDOT) or polyaniline (PANI). When the first functional layer 222a includes a low-molecular-weight material, the first functional layer 222a may include a hole injection layer (HIL) and the HTL.

The second functional layer 222c may be optionally formed. For example, when each of the first functional layer 222a and the emission layer 222b includes a polymer material, the second functional layer 222c may be formed. The second functional layer 222c may be a single layer or multiple layers. The second functional layer 222c may include an electron transport layer (ETL) and/or an electron injection layer (EIL).

The emission layer 222b of the intermediate layer 222 may be arranged for each pixel in the second area A2. The emission layer 222b may be arranged to overlap (e.g., overlap in a z direction or a thickness direction of the substrate 100) an opening of the pixel-defining layer 215 and/or the pixel electrode 221. In an embodiment, the emission layer 222b may be arranged in the opening of the pixel-defining layer 215. The first and second functional layers 222a and 222c of the intermediate layer 222 are each a single body, and may thus be formed on the third area A3 described above with reference to FIG. 5 as well as the second area A2.

An opposite electrode 223 may include a conductive material having a low work function. For example, the opposite electrode 223 may include a (semi-) transparent layer including Ag, Mg, Al, Pt, Pd, Au, Ni, Nd, Ir, Cr, Li, calcium (Ca), or any alloys thereof. In some embodiments, the opposite electrode 223 may further include a layer such as an ITO layer, an IZO layer, a ZnO layer, or an $In_2O_3$ layer on the (semi-)transparent layer including the above-described material. The opposite electrode 223 is a single body and may be formed to cover a plurality of pixel electrodes 221 in the second area A2. The intermediate layer 222 and the opposite electrode 223 may be formed by thermal evaporation.

A spacer 217 may be formed on the pixel-defining layer 215. The spacer 217 secures a space when the encapsulation substrate 300A is placed on the substrate 100, thereby preventing or substantially preventing damage of a light-emitting diode or the like.

The spacer 217 may include an organic insulating material such as polyimide. In some embodiments, the spacer 217 may include an inorganic insulating material such as silicon nitride or silicon oxide, or may include an organic insulating material and an inorganic insulating material. In addition, the spacer 217 may include a material different from a material of the pixel-defining layer 215. In some embodiments, the spacer 217 and the pixel-defining layer 215 may include a same material, and in this case, the pixel-defining layer 215 and the spacer 217 may be formed together in a mask process using a half tone mask or the like. In another embodiment, each of the pixel-defining layer 215 and the spacer 217 may include polyimide.

A capping layer 230 may be arranged on the opposite electrode 223. The capping layer 230 may include lithium fluoride (LiF), an inorganic material, and/or an organic material. In another embodiment, the capping layer 230 may be omitted.

Figure 9:
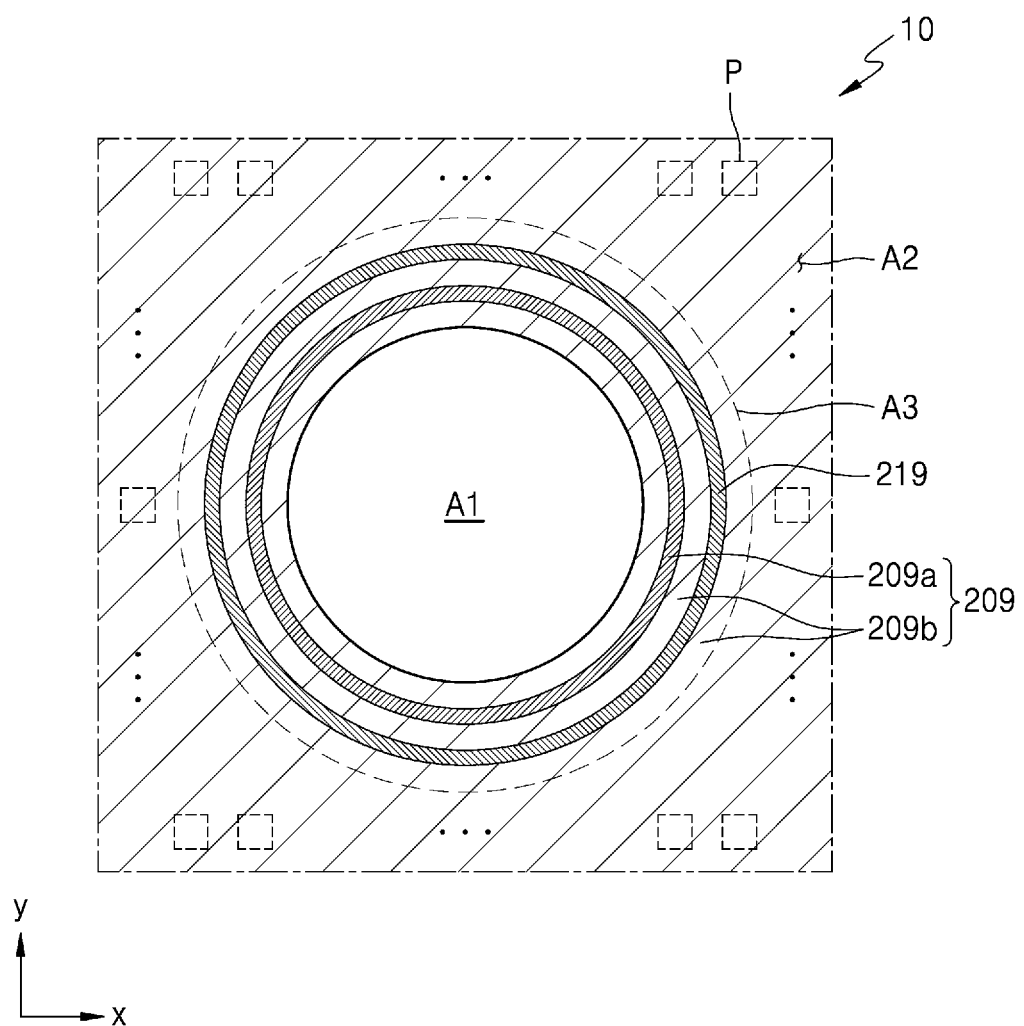
FIG. 9 is a plan view schematically illustrating a portion of a display panel according to an embodiment.
Figure 10:
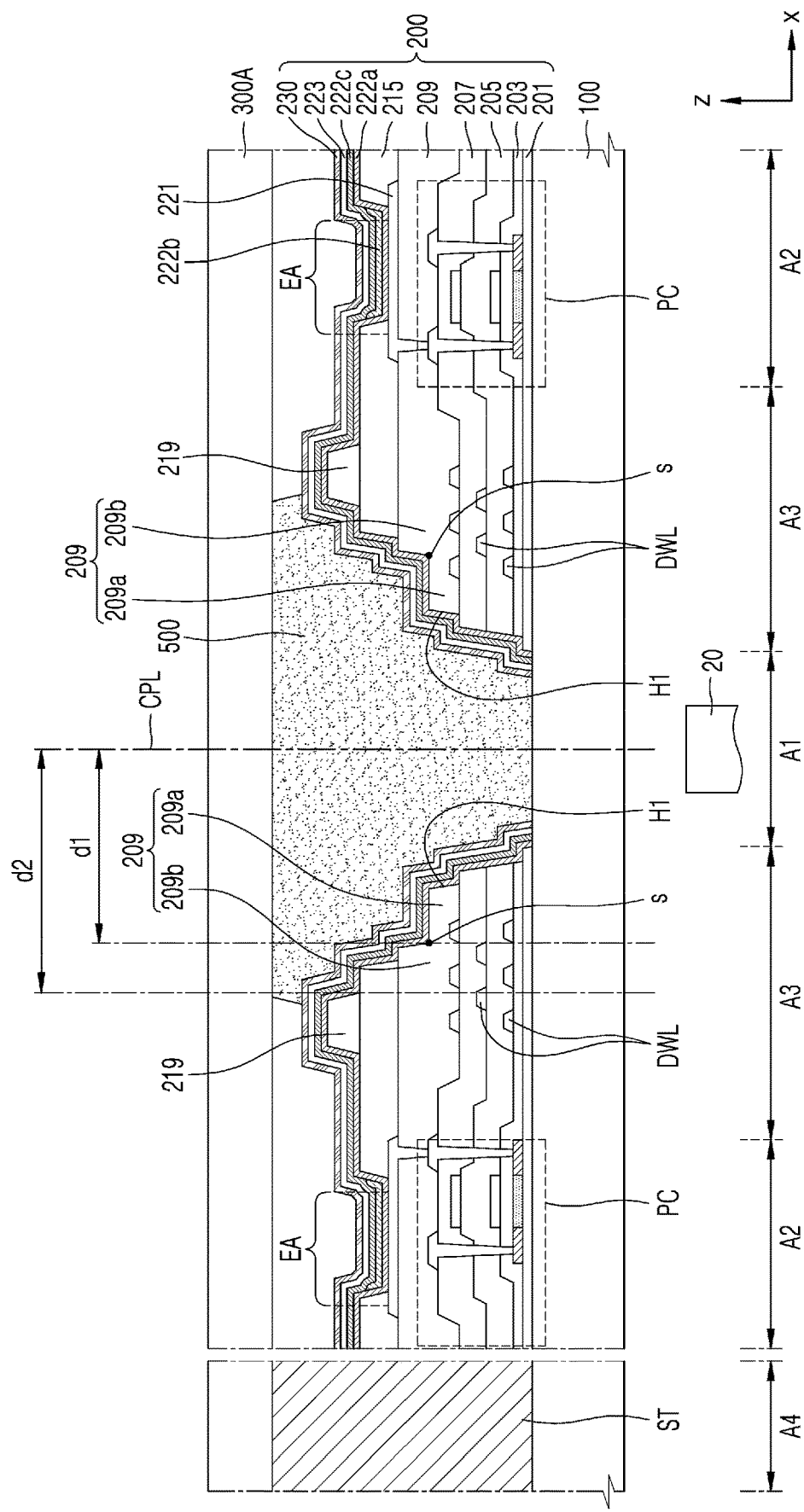
FIG. 10 is a cross-sectional view schematically illustrating a portion of the display panel in FIG. 9.

FIG. 9 is a plan view schematically illustrating a portion of the display panel 10 according to an embodiment, and FIG. 10 is a cross-sectional view schematically illustrating a portion of the display panel 10 of FIG. 9. In the drawings, the same reference numerals denote the same, and thus, redundant descriptions thereof may not be repeated.

Referring to FIG. 9, the display panel 10 according to an embodiment may include an organic insulating layer 209 and a partition wall 219 surrounding the first area A1.

The organic insulating layer 209 may include a first portion 209a surrounding the first area A1 and a second portion 209b surrounding the first portion 209a. For example, the first portion 209a may be closer to the first area A1 than the second portion 209b is to the first area A1. In this case, the first portion 209a and the second portion 209b may include a same material and may be located on or at a same layer.

The first portion 209a of the organic insulating layer 209 may be arranged in the third area A3. In other words, the first portion 209a may cover at least part of the third area A3. The first portion 209a may have a first hole H1 (e.g., see FIG. 10) corresponding to the first area A1. In addition, the first portion 209a may have a closed-loop shape surrounding the first area A1 in a plan view. In an embodiment, the first hole H1 may overlap the first area A1 when viewed from a direction perpendicular to the upper surface of the substrate 100 (e.g., see FIG. 10) (or in a plan view). A diameter of the first hole H1 may be greater than a diameter of the first area A1.

In an embodiment, a bypass line DWL, an internal circuit, or the like may not be arranged in an area between an inner surface of the first portion 209a and the first area A1, and the area may be formed by removing the organic insulating layer 209. In addition, at least some of the buffer layer 201, the gate insulating layer 203, the first interlayer insulating layer 205, and the second interlayer insulating layer 207 arranged under the organic insulating layer 209 and each extending from the third area A3 may be arranged in the area between the inner surface of the first portion 209a and the first area A1.

The second portion 209b of the organic insulating layer 209 may cover at least a portion of the second area A2 and at least a portion of the third area A3. In other words, the second portion 209b may extend from the second area A2 toward a center direction of the first area A1 and cover at least part of the third area A3. The second portion 209b may be formed as a single body with the first portion 209a. In addition, the second portion 209b may surround the first area A1 in a plan view. Further, the second portion 209b may surround the first portion 209a in a plan view.

The partition wall 219 may be arranged on the organic insulating layer 209 in the third area A3. For example, the partition wall 219 may be arranged on the organic insulating layer 209 with the pixel-defining layer 215 therebetween. The partition wall 219 may surround the first area A1 and may have a closed-loop shape. Further, the partition wall 219 may surround the first portion 209a of the organic insulating layer 209 in a plan view. The partition wall 219 may serve as an outer dam that surrounds the first area A1 and blocks the inflow of a filler material layer 500 (e.g., see FIG. 10) arranged in the first area A1 into the second area A2. To this end, the partition wall 219 may form a highest stacked structure in an area adjacent to an edge of the first area A1.

The partition wall 219 and the spacer 217 (e.g., see FIG. 8) described above may include a same material. For example, the partition wall 219 may include an organic insulating material such as polyimide. In some embodiments, the spacer 217 may include an inorganic insulating material such as silicon nitride or silicon oxide, or may include an organic insulating material and an inorganic insulating material. Also, the partition wall 219 and the spacer 217 may be arranged on a same layer. Accordingly, the partition wall 219 may be formed concurrently (e.g., simultaneously) with the spacer 217 in one process.

Referring to FIG. 10, the buffer layer 201, the gate insulating layer 203, the first interlayer insulating layer 205, the second interlayer insulating layer 207, and the organic insulating layer 209 may be arranged on the substrate 100. The pixel circuit PC may include a thin-film transistor and a storage capacitor, and a semiconductor layer and electrodes of the thin-film transistor and electrodes of the storage capacitor may be arranged on the above-described insulating layers, respectively.

The pixel electrode 221 may be connected to the thin-film transistor of the pixel circuit PC through a contact hole of the organic insulating layer 209.

The pixel-defining layer 215 arranged on the pixel electrode 221 may include an opening overlapping the pixel electrode 221, which may define an emission area EA. The first functional layer 222a, the emission layer 222b, the second functional layer 222c, the opposite electrode 223, and the capping layer 230 may be stacked in sequence on the pixel-defining layer 215. Materials and characteristics of the display layer 200 arranged on the substrate 100 are as described above with reference to FIG. 8.

The insulating layers included in the display layer 200, the first functional layer 222a, the second functional layer 222c, the opposite electrode 223, and the capping layer 230 may respectively have through holes corresponding to the first area A1. Accordingly, the light transmittance of the first area A1 may increase. For example, the through holes may be respectively formed in the buffer layer 201, the gate insulating layer 203, the first interlayer insulating layer 205, the second interlayer insulating layer 207, the organic insulating layer 209, and the pixel-defining layer 215 so as to correspond to the first area A1. The through holes form a staircase-shaped structure surrounding the first area A1. In other words, at least some of inner surfaces of the through holes may have steps and form a staircase-shaped structure.

Through this staircase-shaped structure, a filling material included in the filler material layer 500 may be evenly filled step by step in a process of forming the filler material layer 500 so as to correspond to the first area A1. For example, diameters of the through holes included in the staircase-shaped structure increase as a distance from the upper surface of the substrate 100 increases. Accordingly, the filling material receives a force concentrated toward the direction of the center of the first area A1. The filling material may be filled step by step from the center portion of the first area A1 that is close to the upper surface of the substrate 100, along steps of the staircase-shaped structure. In addition, because the filling material receives the force concentrated toward the center direction of the first area A1, the filling material may not overflow toward an outer or outward direction of the first area A1 (e.g., a direction from the center of the first area A1 to the second area A2). Therefore, the filler material layer 500 may be formed so as not to overlap the second area A2.

Referring to FIG. 10, each of the first functional layer 222a, the second functional layer 222c, the opposite electrode 223, and the capping layer 230 extends to the edge of the first area A1 of the first portion 209a, but they may be disconnected in the third area A3. For example, the first functional layer 222a, the second functional layer 222c, the opposite electrode 223, and the capping layer 230 may be disconnected in the first portion 209a of the organic insulating layer 209.

The upper surface of the first portion 209a and the upper surface of the second portion 209b of the organic insulating layer 209 may form a step. The first portion 209a and the second portion 209b may be formed as a single body and may extend from a stepped point s of the first portion 209a and the second portion 209b toward the center of the first area A1. Here, the "stepped point s" may denote a point where the upper surface of the first portion 209a and the inner surface of the second portion 209b meet. A distance (e.g., distance in the z direction or the thickness direction of the substrate 100) from the upper surface of the substrate 100 to the upper surface of the first portion 209a may be less than a distance (e.g., distance in the z direction or the thickness direction of the substrate 100) from the upper surface of the substrate 100 to an upper surface of the second portion 209b. In other words, the upper surface of the first portion 209a may be lower than the upper surface of the second portion 209b in a cross-sectional view.

In an embodiment, a thickness of the first portion 209a and a thickness of the second portion 209b may be different from each other in a cross-sectional view. The first portion 209a and the second portion 209b include a same material and are on a same layer, but may have different thicknesses from each other. For example, the thickness of the first portion 209a may be less than that of the second portion 209b in a cross-sectional view. As described above, because the first portion 209a and the second portion 209b have different thicknesses from each other, a step of the upper surface of the first portion 209a and the second portion 209b may increase.

In order for the organic insulating layer 209 to have different thicknesses for each part, a half tone mask process may be applied. Here, the mask may denote a mask assembly including a frame having one or more openings (open areas) and a mask having one or more opening portions formed according to a pattern. Further, the half tone mask may refer to a mask including a full transmission area, a semi-transmission area, and a non-transmission area.

For example, a photoresist film may be formed on the organic insulating layer 209. The photoresist film may include a photoresist material that causes chemical changes when irradiated with light. The photoresist film is a positive type photoresist and may include PMMA, naphthoquinone diazide, polybutene-1-sulfone, and the like, but is not limited thereto. For example, the photoresist film may include aromatic bis-azide, methacrylic acid ester, and cinnamic acid ester as a negative type photoresist. Hereinafter, for convenience of description, a case where a photoresist film including a positive photoresist is applied will be described as an example.

Then, a photoresist film pattern may be formed through a half tone mask process. An area overlapping the full transmission area of the half tone mask becomes an uncoated area formed by completely removing a photoresist film, an area overlapping the semi-transmission area of the half tone mask becomes a semi-coated area formed by removing only a portion of the photoresist film, and an area overlapping the non-transmission area of the half tone mask becomes a full-coated area formed by retaining the photoresist film. When an etching process and a photoresist film removal process are performed while the photoresist film with such differential thicknesses is coated, the uncoated area becomes a portion formed by removing the organic insulating layer 209, the semi-coated area becomes the first portion 209a of the organic insulating layer 209, and the full-coated area becomes the second portion 209b.

The partition wall 219 may be arranged on the organic insulating layer 209 in the second area A2. In an embodiment, the partition wall 219 may overlap the second portion 209b of the organic insulating layer 209 when viewed from a direction perpendicular to the upper surface of the substrate 100 (or in a plan view). Because the upper surface of the second portion 209b is located higher in a cross-sectional view than the upper surface of the first portion 209a, an upper surface of the partition wall 219 may be located higher when the partition wall 219 overlaps the second portion 209b than when the partition wall 219 overlaps the first portion 209a. In other words, when the partition wall 219 overlaps the second portion 209b, a distance from the upper surface of the substrate 100 to the upper surface of the partition wall 219 increases, and a distance from a lower surface of the encapsulation substrate 300A to the upper surface of the partition wall 219 decreases. Through this, the partition wall 219 may more effectively prevent or substantially prevent the filler material layer 500 arranged between the substrate 100 and the encapsulation substrate 300A in the first area A1 from spreading away from the center of the first area A1.

In an embodiment, the pixel-defining layer 215 may be arranged between (e.g., between in the z direction or the thickness direction of the substrate 100) the organic insulating layer 209 and the partition wall 219 in the third area A3. Through this, the upper surface of the partition wall 219 may be elevated by a thickness of the pixel-defining layer 215. In addition, in an embodiment, the partition wall 219 may overlap the second portion 209b of the organic insulating layer 209, and the pixel-defining layer 215 may be arranged between the second portion 209b of the organic insulating layer 209 and the partition wall 219. In this case, the upper surface of the partition wall 219 may be arranged higher than when the partition wall 219 overlaps the first portion 209a.

An edge of the partition wall 219 in the center direction of the first area A1 may be farther or equally apart from the center of the first area A1 compared to the stepped point s of the first portion 209a and the second portion 209b. In other words, a first distance d1 from a virtual center line CPL perpendicular to the upper surface of the substrate 100 through the center of the first area A1 to the stepped point s of the first portion 209a and second portion 209b may be less than or equal to a second distance d2 from the virtual center line CPL to the edge of the partition wall 219 in the center direction of the first area A1 (e.g., the x direction).

FIG. 10 shows a case where the edge of the partition wall 219 in the center direction of the first area A1 is farther from the center of the first area A1 than the stepped point s of the first portion 209a and the second portion 209b. In this case, the stepped point s of the first portion 209a and the second portion 209b may be located between the partition wall 219 and the center of the first area A1. Through this, the step of the first portion 209a and the second portion 209b may contribute to the staircase-shaped structure surrounding the first area A1.

The encapsulation substrate 300A is arranged to face the substrate 100. In an embodiment, in the first area A1, materials included in the display layer 200 may not be arranged between a bottom surface of the encapsulation substrate 300A and the upper surface of the substrate 100. In other words, in the first area A1, the upper surface of the substrate 100 may face (e.g., directly face) the bottom surface of the encapsulation substrate 300A with the filler material layer 500 therebetween.

The encapsulation substrate 300A and the substrate 100 may include a same material and have a same refractive index. For example, each of the substrate 100 and the encapsulation substrate 300A may have a refractive index of about 1.3 to about 1.7, for example, about 1.5.

The filler material layer 500 may be located between the substrate 100 and the encapsulation substrate 300A. The filler material layer 500 may be arranged so as to correspond to the first area A1, and in some embodiments, may be arranged in a portion of the third area A3. The filler material layer 500 may be shielded or contained by the partition wall 219 so as not to be arranged in the second area A2.

To this end, an edge of the filler material layer 500 may be located near the partition wall 219. In an embodiment, the filler material layer 500 may not cover the partition wall 219, and the edge of the filler material layer 500 may be closer toward the center of the first area A1 than the edge of the partition wall 219 in the direction of the center of the first area A1. In another embodiment, the filler material layer 500 may cover part of the partition wall 219, and the edge of the filler material layer 500 may be located on the partition wall 219. In another embodiment, the filler material layer 500 may completely cover the partition wall 219, and the edge of the filler material layer 500 may be located adjacent to the edge of the partition wall 219 in a direction of the second area A2. In any case described above, the edge of the filler material layer 500 is in the third area A3, and the filler material layer 500 does not overlap the second area A2.

The filler material layer 500 may include a transparent material having high light transmittance. For example, the filler material layer 500 may include a material having a light transmittance of about 90% or more. In particular, the filler material layer 500 may include a material having a light transmittance of about 95% or more. In addition, the filler material layer 500 may include a transparent material having a refractive index similar to that of the substrate 100 and the encapsulation substrate 300A. For example, the filler material layer 500 may include a transparent resin for filling without outgassing, such as an OCR. By placing a filler to correspond to the first area A1, the transmittance and reflectance of light passing through the first area A1 may be improved. In addition, the filler material layer 500 may be arranged between the substrate 100 and the encapsulation substrate 300A to improve structural stability of the substrate 100 and the encapsulation substrate 300A, thereby improving the reliability of the display device.

Figure 11:
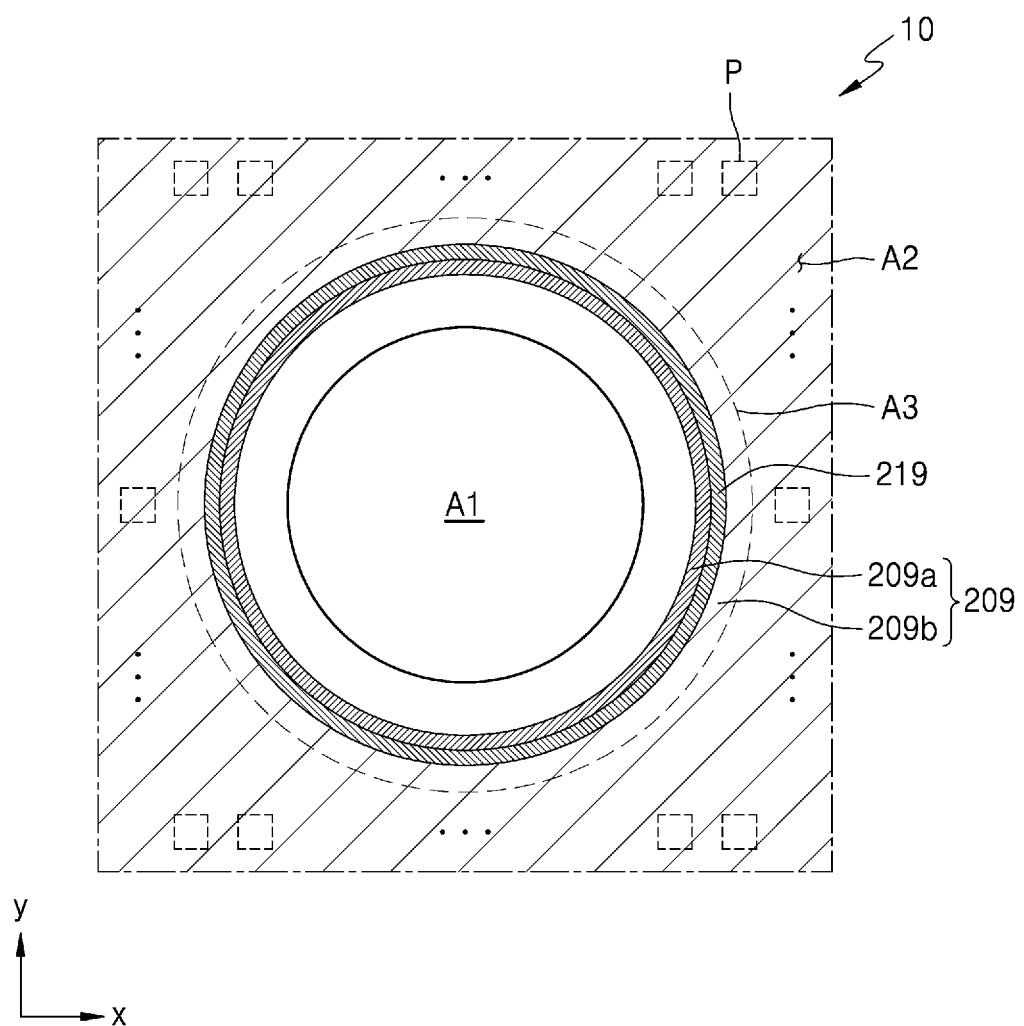
FIG. 11 is a plan view schematically illustrating a portion of a display panel according to another embodiment.
Figure 12:
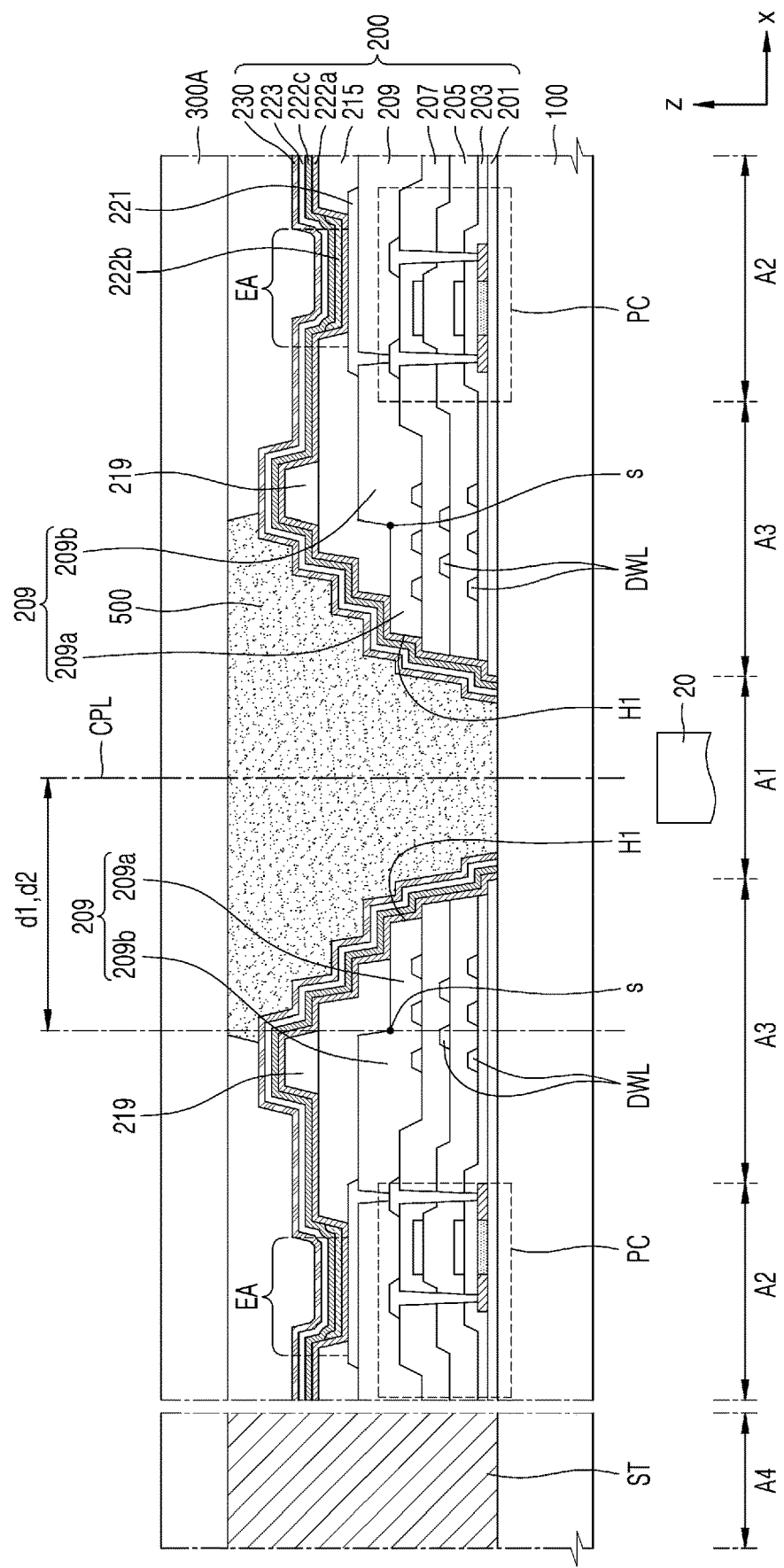
FIG. 12 is a cross-sectional view schematically illustrating a portion of the display panel in FIG. 11.

FIG. 11 is a plan view schematically illustrating a portion of a display panel 10 according to another embodiment, and FIG. 12 is a cross-sectional view schematically illustrating a portion of the display panel 10 of FIG. 11. Hereinafter, a description will be given focusing on the difference from the embodiments of FIGS. 9 and 10, and a redundant description of the content overlapping with the above description may not be repeated.

An area between the first portion 209a and the partition wall 219 may be a dead space in a plan view. Therefore, it is desirable to minimize or reduce the area between the first portion 209a and the partition wall 219 in a plan view.

Referring to FIG. 11, the display panel 10 according to an embodiment may not include an area between the first portion 209a and the partition wall 219 in a plan view. For example, an outer edge of the first portion 209a and an inner edge of the partition wall 219 may coincide with each other. In this case, the outer edge of the first portion 209a may be understood as the stepped point s of the first portion 209a and the second portion 209b.

Referring to FIG. 12, the first distance d1 from the virtual center line CPL perpendicular to the upper surface of the substrate 100 and passing through the center of the transmission area to the stepped point s of the first portion 209a and second portion 209b may be equal to the second distance d2 from the virtual center line CPL to the edge of the partition wall 219 in the direction of the center of the first area A1 (e.g., the x direction). In other words, the stepped point s of the first portion 209a and the second portion 209b and the edge of the partition wall 219 in the direction of the center of the first area A1 may be located on a virtual straight line perpendicular to the upper surface of the substrate 100 in a cross-sectional view. Through this, the dead space surrounding the first area A1 may be minimized or reduced.

Further, in the embodiment, the pixel-defining layer 215 located between the organic insulating layer 209 and the partition wall 219 may have a step while continuously covering the first portion 209a and the second portion 209b. In other words, the pixel-defining layer 215 extends by covering the stepped point s of the first portion 209a and the second portion 209b, and thus has a step as much as or similar to the step of the upper surface of the first portion 209a and the upper surface of the second portion 209b. In addition, the step of the pixel-defining layer 215 may contribute to the staircase-shaped structure surrounding the first area A1 described above.

Figure 13:
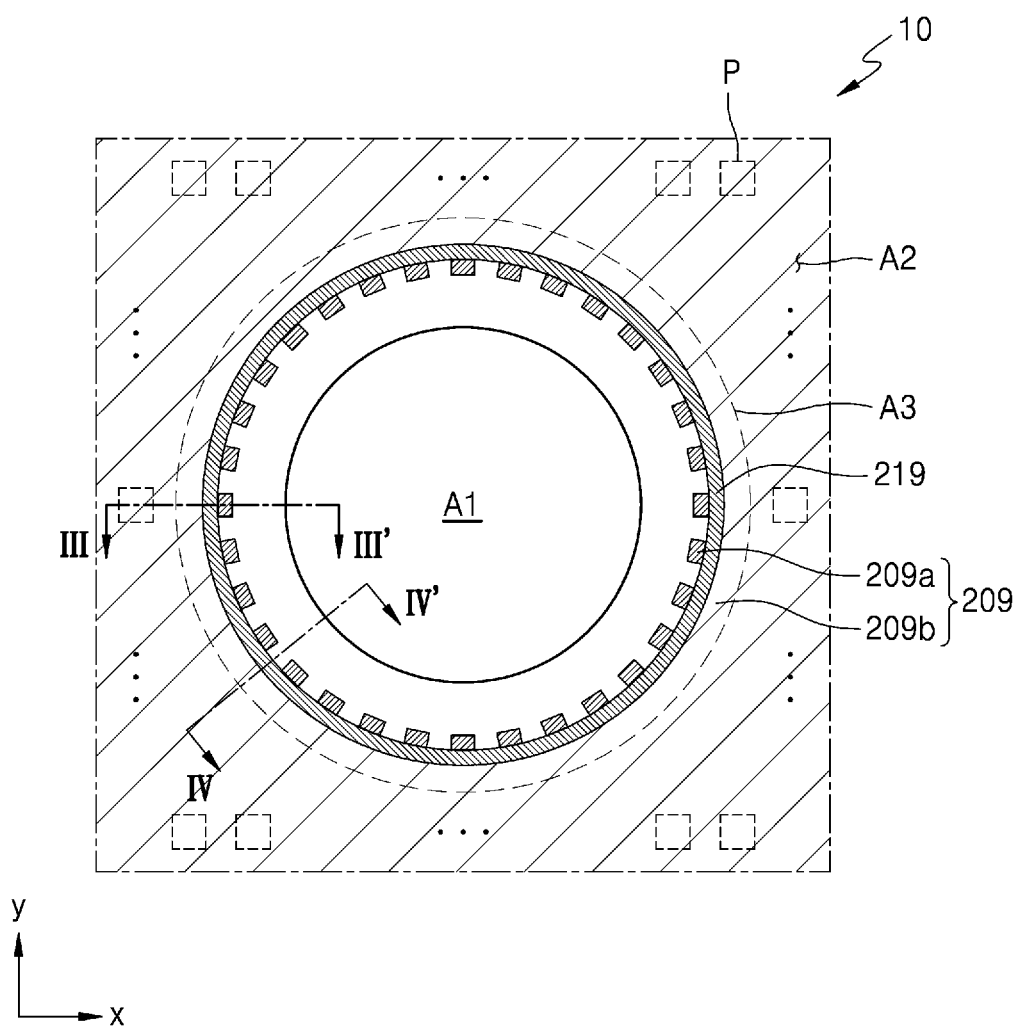
FIG. 13 is a plan view schematically illustrating a portion of a display panel according to another embodiment.
Figure 14:
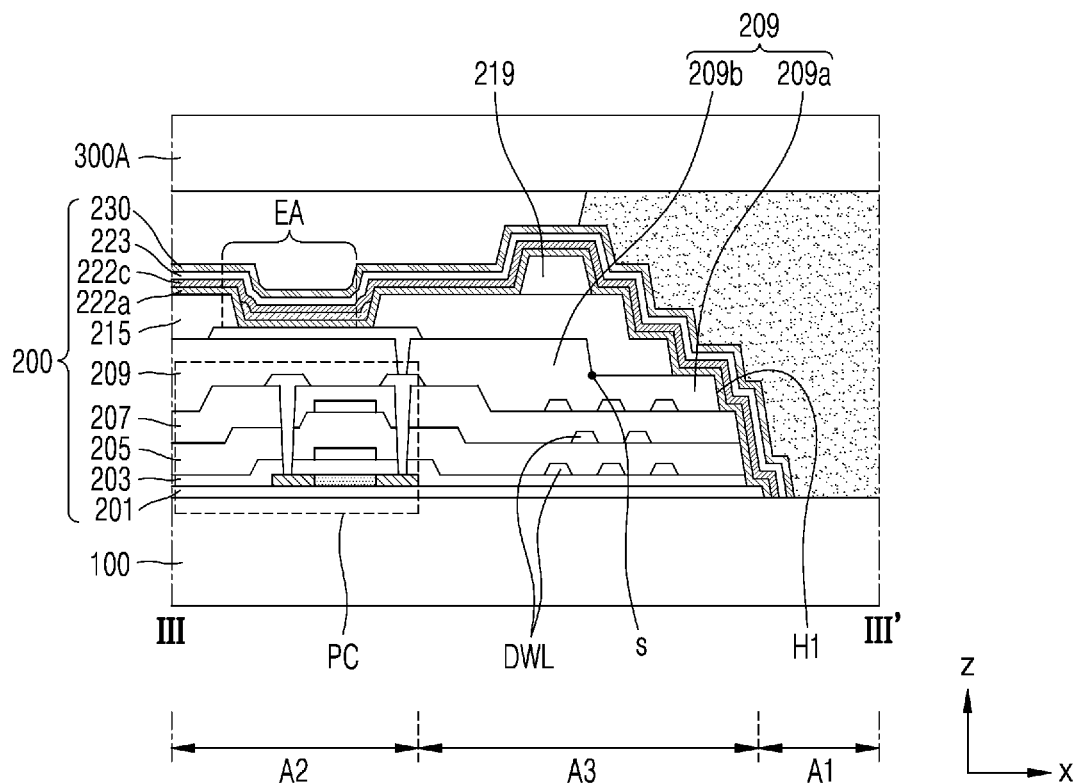
FIGS. 14 and 15 are cross-sectional views schematically illustrating a portion of the display panel in FIG. 13.
Figure 15:
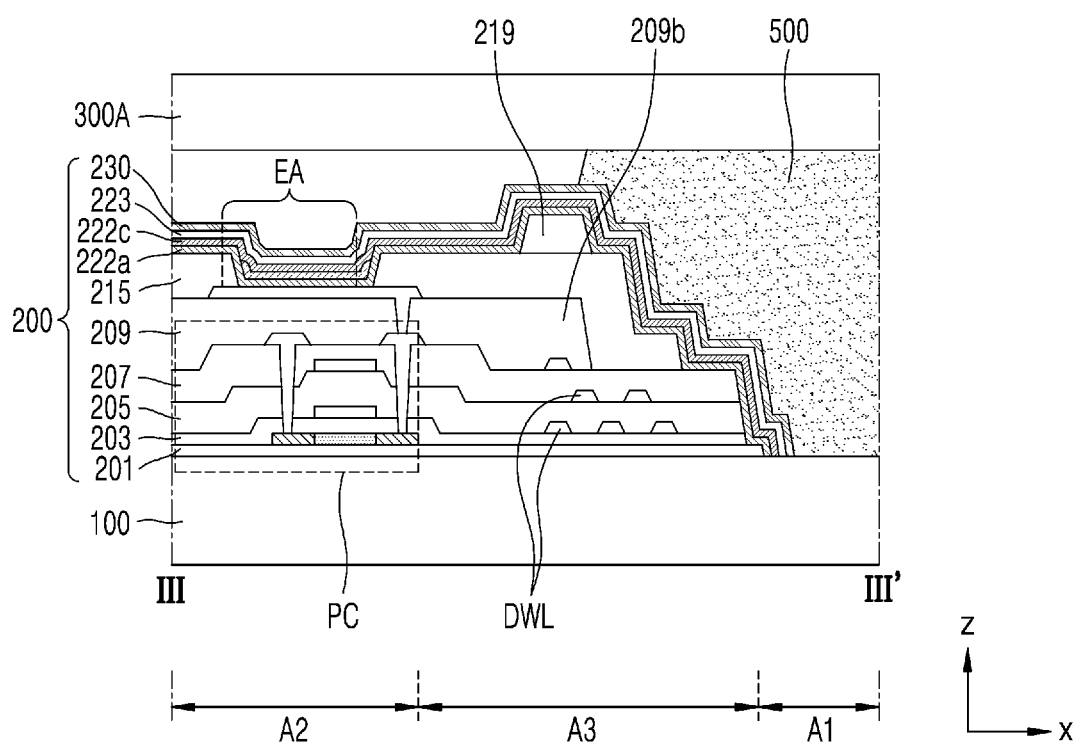

FIG. 13 is a plan view schematically illustrating a portion of a display panel 10 according to another embodiment, and FIGS. 14 and 15 are cross-sectional views schematically illustrating a portion of the display panel 10 of FIG. 13. Hereinafter, a description will be given focusing on the difference from the embodiments of FIGS. 9-12, and a redundant description of the content overlapping with the above description may not be repeated.

Referring to FIG. 13, the display panel 10 according to an embodiment may include the first portion 209a of the organic insulating layer 209 having a sawtooth shape. For example, the first portion 209a may include protrusions arranged along a periphery of the first area A1 in a plan view. The protrusions included in the first portion 209a may be arranged spaced from each other at regular intervals, but are not limited thereto. For example, the number of protrusions included in the first portion 209a, spacing between the protrusions, a length and width of each of the protrusions, and an arrangement of the protrusions may be variously changed in a suitable manner according to the design.

FIG. 14 is a cross-sectional view of the display panel 10 according to an embodiment, taken along the line III-Ill' in FIG. 13 that passes through an area including the protrusions included in the first portion 209a, and FIG. 15 may correspond to a cross-sectional view of the display panel 10 according to an embodiment, taken along the line IV-IV' in FIG. 13 that passes through an area not including the protrusions included in the first portion 209a.

Referring to FIG. 14, in areas provided with the protrusions included in the first portion 209a include, as in the above-described embodiments, the organic insulating layer 209 includes the first portion 209a and the second portion 209b, and the first portion 209a and the second portion 209b have a step difference between them. On the other hand, referring to FIG. 15, areas without the protrusions included in the first portion 209a includes only the second portion 209b and does not include the first portion 209a, unlike the embodiment described above. Accordingly, the organic insulating layer 209 does not have a step.

As described above, areas in which the first portion 209a is located and areas in which the first portion 209a is not located are alternately formed along the periphery of the first area A1. In this case, the areas in which the first portion 209a is located may be understood as a convex portion compared to an area adjacent thereto, and the areas in which the first portion 209a is not located may be understood as a concave portion compared to an area adjacent thereto. As a result, the edge of the first area A1 may be formed in an uneven structure in which a convex portion and a concave portion are alternately located. In addition, the filler material layer 500 is located by covering the uneven structure. Through this, in the process of forming the filler material layer 500, the filler material may be more evenly filled in stages from the center and may not overflow outward of the first area A1.

Although FIGS. 13-15 show a case where the display panel 10 does not have a space between the first portion 209a and the partition wall 219 as in the embodiments of FIGS. 11 and 12, the presently described features and aspects may be applied to a case where the display panel 10 has a space between the first portion 209a and the partition wall 219 as in the embodiments of FIGS. 9 and 10.

In addition, the electronic apparatus 2 (e.g., see FIG. 3) according to an embodiment may include the display device 1 (e.g., see FIG. 2) according to the embodiments described with reference to FIGS. 4-15 and the component 20 (e.g., see FIG. 3) overlapping the area A1 of the display device 1.

The display device and the electronic apparatus are primarily described above, but the present disclosure is not limited thereto. For example, a method of manufacturing such a display device and an electronic apparatus also fall within the scope of the present disclosure.

According to an embodiment configured as described above, the occurrence of defects in a manufacturing process or a use process after the manufacturing process may be minimized or reduced in a display device having a transmission area and an electronic apparatus. However, the scope of the present disclosure is not limited by these effects.

It should be understood that the embodiments described herein should be considered in a descriptive sense only and not for purposes of limitation. Descriptions of features or aspects within each of the embodiments should typically be considered as available for other similar features or aspects in other embodiments. While one or more embodiments have been described with reference to the figures, it will be understood by those of ordinary skill in the art that various changes in form and details may be made therein without departing from the spirit and scope of the present disclosure including the following claims, and equivalents thereof.

What is claimed is:

1. A display device comprising:
a substrate having a transmission area, a display area surrounding the transmission area, and an intermediate area between the transmission area and the display area;
an organic insulating layer located on the substrate and comprising a first portion and a second portion, wherein the first portion has a first hole corresponding to the transmission area, and wherein the second portion surrounds the first portion and has an upper surface forming a step with an upper surface of the first portion;
display elements located on the organic insulating layer in the display area;
a partition wall located on the organic insulating layer in the intermediate area; and
a filling material layer overlapping the transmission area, wherein the first portion and the second portion are a single body, and
wherein a distance from an upper surface of the substrate to the upper surface of the first portion is less than a distance from the upper surface of the substrate to the upper surface of the second portion.

2. The display device of claim 1, wherein the partition wall overlaps the second portion.

3. The display device of claim 2, wherein a first distance from a virtual center line perpendicular to the upper surface of the substrate and passing through a center of the transmission area to a stepped point of the first portion and the second portion is less than or equal to a second distance from the virtual center line to the partition wall.

4. The display device of claim 2, wherein a stepped point of the first portion and the second portion is located between the partition wall and a center of the transmission area.

5. The display device of claim 2, further comprising a pixel-defining layer located between the organic insulating layer and the partition wall, the pixel-defining layer having a step difference and continuously covering the first portion and the second portion.

6. The display device of claim 1, wherein the second portion of the organic insulating layer has a closed-loop shape surrounding the transmission area in a plan view.

7. The display device of claim 1, wherein the second portion of the organic insulating layer comprises protrusions arranged along a periphery of the transmission area in a plan view.

8. The display device of claim 7, wherein the protrusions are spaced from each other at regular intervals.

9. The display device of claim 1, wherein the partition wall has a closed-loop shape surrounding the transmission area in a plan view.

10. The display device of claim 1, further comprising an encapsulation substrate facing the substrate,
wherein the filling material layer is located between the substrate and the encapsulation substrate.

11. The display device of claim 10, wherein an edge of the filling material layer is located near the partition wall.

12. An electronic apparatus comprising:
a display device having a transmission area, a display area surrounding the transmission area, and an intermediate area between the transmission area and the display area; and
a component overlapping the transmission area,
wherein the display device comprises:
a substrate;
an organic insulating layer located on the substrate and comprising a first portion and a second portion, wherein the first portion has a first hole corresponding to the transmission area, and wherein the second portion surrounds the first portion and has an upper surface forming a step with an upper surface of the first portion;

display elements located on the organic insulating layer in the display area;

a partition wall located on the organic insulating layer in the intermediate area;

an encapsulation substrate covering the display elements and the partition wall; and a filling material layer located between the substrate and the encapsulation substrate in the transmission area, wherein the first portion and the second portion are a single body, and wherein a distance from an upper surface of the substrate to the upper surface of the first portion is less than a distance from the upper surface of the substrate to the upper surface of the second portion.

13. The electronic apparatus of claim 12, wherein the partition wall overlaps the second portion.

14. The electronic apparatus of claim 12, wherein a first distance from a virtual center line perpendicular to the upper surface of the substrate and passing through a center of the transmission area to a stepped point of the first portion and the second portion is less than or equal to a second distance from the virtual center line to the partition wall.

15. The electronic apparatus of claim 12, wherein a stepped point of the first portion and the second portion is located between the partition wall and a center of the transmission area.

16. The electronic apparatus of claim 12, further comprising a pixel-defining layer located between the organic insulating layer and the partition wall, the pixel-defining layer continuously covering the first portion and the second portion and having a step difference.

17. The electronic apparatus of claim 12, wherein the second portion of the organic insulating layer has a closed-loop shape surrounding the transmission area in a plan view.

18. The electronic apparatus of claim 12, wherein the second portion of the organic insulating layer comprises protrusions arranged along a periphery of the transmission area in a plan view.

19. The electronic apparatus of claim 18, wherein the protrusions are spaced from each other at regular intervals.

20. The electronic apparatus of claim 12, wherein an edge of the filling material layer is located near the partition wall.

* * * * *